(12) United States Patent
Ogura et al.

(10) Patent No.: US 8,084,567 B2
(45) Date of Patent: Dec. 27, 2011

(54) EPOXY RESIN COMPOSITION AND CURED ARTICLE THEREOF, NOVEL EPOXY RESIN AND PRODUCTION METHOD THEREOF, AND NOVEL PHENOL RESIN

(75) Inventors: Ichirou Ogura, Ichihara (JP); Kunihiro Morinaga, Ichihara (JP); Kazuo Arita, Ichihara (JP); Yutaka Sato, Sakura (JP)

(73) Assignee: Dainippon Ink & Chemicals, Inc., Tokyo (JP)

( * ) Notice: Subject to any disclaimer, the term of this patent is extended or adjusted under 35 U.S.C. 154(b) by 0 days.

(21) Appl. No.: 12/615,459

(22) Filed: Nov. 10, 2009

(65) Prior Publication Data

US 2010/0056747 A1   Mar. 4, 2010

Related U.S. Application Data

(62) Division of application No. 11/908,464, filed as application No. PCT/JP2006/305264 on Mar. 16, 2006.

(30) Foreign Application Priority Data

Mar. 18, 2005  (JP) ................ 2005-079223
Mar. 30, 2005  (JP) ................ 2005-097866

(51) Int. Cl.
    *C08G 59/00*  (2006.01)
(52) U.S. Cl. ........................................ 528/87
(58) Field of Classification Search ............. 528/87
    See application file for complete search history.

(56) References Cited

U.S. PATENT DOCUMENTS

| 3,551,519 A | * | 12/1970 | Dubsky et al. | ........... 525/502 |
| 2009/0069490 A1 | | 3/2009 | Ogura et al. | |
| 2009/0099303 A1 | | 4/2009 | Arita et al. | |

FOREIGN PATENT DOCUMENTS

| CA | 2045291 A | | 12/1991 |
| EP | 0467826 A2 | | 1/1992 |
| EP | 0559338 A1 | | 9/1993 |
| EP | 0682052 A1 | | 11/1995 |
| JE | 2-227418 A | | 9/1990 |
| JP | 04359919 A | * | 12/1992 |
| JP | 5-132544 A | | 5/1993 |

(Continued)

OTHER PUBLICATIONS

English machine translation of JP Patent Pub No. 06-263839 A, Ogura et al, Sep. 20, 1994.*
Abstract in English of JP 04359919 A, Imura et al, Dec. 14, 1992.*
International Search Report of PCT/JP2006/305264, date of mailing May 2, 2006.

(Continued)

Primary Examiner — Mark Eashoo
Assistant Examiner — David Karst
(74) Attorney, Agent, or Firm — Westerman, Hattori, Daniels & Adrian, LLP

(57) ABSTRACT

The present invention relates to a composition containing as a main component, an epoxy resin which has a structure comprising a polyaryleneoxy structure such as polynaphthylene oxide as a main skeleton, (methyl)glycidyloxy group and aralkyl group being introduced on an aromatic ring of the polyaryleneoxy structure, and which has low viscosity, according to the present invention, there can be provided an epoxy resin composition which can impart remarkably excellent flame retardancy and dielectric characteristics to a cured article and a cured article thereof, an epoxy resin, a phenol resin as an intermediate of the epoxy resin, and a method for producing the epoxy resin.

3 Claims, 12 Drawing Sheets

FOREIGN PATENT DOCUMENTS

| | | | |
|---|---|---|---|
| JP | 5-140265 | A | 6/1993 |
| JP | 05-304001 | A | 11/1993 |
| JP | 06263839 | A * | 9/1994 |
| JP | 8-120039 | A | 5/1996 |
| JP | 8-127636 | A | 5/1996 |
| JP | 8-283379 | A | 10/1996 |
| JP | 2003-280192 | A | 10/2003 |
| JP | 2004-59714 | A | 2/2004 |
| JP | 2005-15689 | A | 1/2005 |
| JP | 2006-307162 | A | 11/2006 |

OTHER PUBLICATIONS

European Search Report dated Aug. 5, 2009, issued in corresponding European Patent Application No. 06823296.6.

International Search Report of PCT/JP2006/322474, date of mailing Dec. 12, 2006.

Final Office Action dated Jun. 11, 2010, issued in U.S. Appl. No. 12/280,934.

English Machine Translation of JP Patent Pub No. 05-178982 A, Mizoguchi et al., Jul. 20, 1993.

* cited by examiner

EPOXY RESIN COMPOSITION AND CURED ARTICLE THEREOF, NOVEL EPOXY RESIN AND PRODUCTION METHOD THEREOF, AND NOVEL PHENOL RESIN

CROSS-REFERENCE TO RELATED APPLICATIONS

This application is a division of U.S. application Ser. No. 11/908,464, filed on Sep. 12, 2007 which is a National Stage of International Patent Application No. PCT/JP2006/305264, filed on Mar. 16, 2006.

BACKGROUND OF THE INVENTION

1. Field of the Invention

The present invention relates to an epoxy resin composition which gives an excellent cured article without using an additive flame retardant and is excellent in dielectric characteristics, and is also suited for use as a resin composition for semiconductor devices and circuit board devices, and a cured article thereof, a novel epoxy resin used therefore and a production method thereof, and a novel phenol resin as an intermediate of the epoxy resin.

2. Description of the Related Art

An epoxy resin is widely used in the fields of electronics and high functional coating materials because it gives a cured article which causes less shrinkage during curing and is excellent in dimensional stability, electrical insulation properties and chemical resistance. In the field of electronics such as semiconductor encapsulating materials, with the progress of surface mounting of semiconductors and size reduction of semiconductors for the purpose of attaining higher density of electronic components, moisture resistance, particularly solder cracking resistance after subjecting to a moisture resistance test has recently been required strongly to sealing materials. To meet such a requirement, there is known a technique in which the number of aromatic nucleus in the resin is increased and the amount of secondary hydroxyl groups formed during the curing reaction is decreased, and thus moisture resistance of the cured article is improved and stress is reduced. For example, there are proposed an epoxy resin composition in which a solid novolak resin having a reduced functional group concentration obtained by reacting a monostyrenated phenol with formaldehyde or paraformaldehyde is used as a curing agent for epoxy resin (see, for example, Japanese Unexamined Patent Application, First Publication No. H05-132544 (pp. 3-4)) and an epoxy resin composition in which polyglycidyl ether of the solid novolak resin is used (see, for example, Japanese Unexamined Patent Application, First Publication No. H05-140265 (pp. 3-5)). Also there is proposed benzylated polyphenol, which is obtained by modifying polyphenol with a benzylating agent, and thereby a functional group concentration is reduced to improve moisture resistance of the cured article, in particular, to improve package cracking resistance as a surface mounting type semiconductor encapsulating material, and an epoxy resin composition containing the polyglycidyl ether thereof (see, for example, Japanese Unexamined Patent Application, First Publication No. H08-120039 (pp. 4-6)).

The novolak resin, polyphenol, and epoxydated compounds thereof surely have sufficiently low functional group concentration and the resulting cured article is excellent in moisture resistance, and thus obtaining materials which exhibit excellent solder cracking resistance in the fields of electronics and high functional coating materials and can meet the requirement such as lower dielectric constant with recent development of higher-frequency electronic equipments.

However, materials used in the fields of electronics and high functional coating materials must be cope with environmental problems typified by dioxin problem and it has strongly been required to develop a so-called halogen-free flame retardant system in which a resin itself is provided with a flame retardant effect without using a halogen-based additive flame retardant. Although dielectric characteristics are improved in the above-described novolak resin, polyphenol, and epoxydated compounds thereof, since they contain a large amount of flammable pendant-shaped aromatic hydrocarbon groups in the molecular structure, the resulting cured article is inferior in flame retardancy and thus the above-described halogen-free flame retardant system can not be constructed.

Therefore, there has never been obtained an epoxy resin which imparts excellent flame retardancy to the cured article, although it has excellent dielectric characteristics.

SUMMARY OF THE INVENTION

An object of the present invention is to provide an epoxy resin composition which can impart remarkably excellent flame retardancy and dielectric characteristics to the cured article, a novel epoxy resin and a novel phenol resin, an epoxy resin cured article having both performances described above, and a method for producing the epoxy resin.

The present inventors have intensively studied and found that flame retardancy can be remarkably improved without deteriorating dielectric characteristics by introducing a polyaryleneoxy structure into a main skeleton of a resin structure and further introducing an aralkyl structure into the polyaryleneoxy structure, and thus the present invention has been completed.

The present invention relates to an epoxy resin composition (hereinafter, this epoxy resin composition is abbreviated to "epoxy resin composition (I)") comprising, as essential components, an epoxy resin (A) having a molecular structure comprising a polyaryleneoxy structure as a main skeleton, a (methyl) glycidyloxy group and a structural segment represented by the following structural formula (1) being attached to an aromatic ring of the polyaryleneoxy structure Structural formula (1)

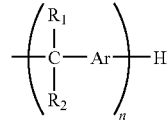

in the formula (1), $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4, and a curing agent (B).

Also the present invention relates to a cured article obtained by curing the epoxy resin composition.

Also the present invention relates to a semiconductor encapsulating material comprising the epoxy resin composition, in addition to the epoxy resin (A) and the curing agent (B), an inorganic filler in the proportion of 70 to 95% by mass based on the total amount of the epoxy resin composition.

Also the present invention relates to a novel epoxy resin which has a molecular structure comprising a polyaryleneoxy structure as a main skeleton, a (methyl)glycidyloxy group and a structural segment represented by the following structural formula (1) being attached to an aromatic ring of the polyaryleneoxy structure

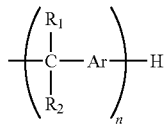

Structural formula (1)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4, and also has a melt viscosity at 150° C., as measured in accordance with "ASTM D4287" of 0.1 to 3.0 dPa·s.

Also the present invention relates to a method for producing an epoxy resin, which comprises the steps of:
reacting a dihydroxyaromatic compound (a1) with an aralkylating agent (a2) selected from a compound represented by the following structural formula (2):

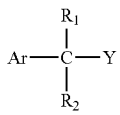

Structural formula (2)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and Y represents a halogen atom, an alkoxy group or hydroxyl group, and a compound represented by the following structural formula (3):

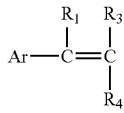

Structural formula (3)

wherein $R_1$, $R_3$ and $R_4$ each independently represents methyl group or hydrogen atom, and Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, in the presence of an acid catalyst to obtain a phenol resin, and reacting the resulting phenol resin with epihalohydrins (a3).

Also the present invention relates to an epoxy resin composition (hereinafter, this epoxy resin composition is abbreviated to "epoxy resin composition (II)") comprising, as essential components,
a phenol resin (B') having a molecular structure comprising a polyaryleneoxy structure as a main skeleton, a phenolic hydroxyl group and a structural segment represented by the following structural formula (1) being attached to an aromatic ring of the polyaryleneoxy structure

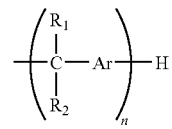

Structural formula (1)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4, and
an epoxy resin (A').

Also the present invention relates to a cured article obtained by curing the epoxy resin composition.

Also the present invention relates to a semiconductor encapsulating material comprising the epoxy resin composition, in addition to the epoxy resin (A') and the phenol resin (B'), an inorganic filler in the proportion of 70 to 95% by mass based on the total amount of the epoxy resin composition.

Also the present invention relates to a novel phenol resin which has a molecular structure comprising a polyaryleneoxy structure as a main skeleton, a phenolic hydroxyl group and a structural segment represented by the following structural formula (1) being attached to an aromatic ring of the polyaryleneoxy structure,

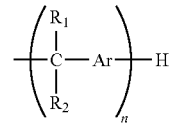

Structural formula (1)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4, and also has a melt viscosity at 150° C., as measured in accordance with "ASTM D4287", of 0.1 to 4.0 dPa·s.

According to the present invention, there can be provided an epoxy resin composition which can impart remarkably excellent flame retardancy and dielectric characteristics to a cured article, a novel epoxy resin and a novel phenol resin, an epoxy resin composition cured article having above performances, and a method for producing the epoxy resin.

DETAILED DESCRIPTION OF THE INVENTION

Figure 1:
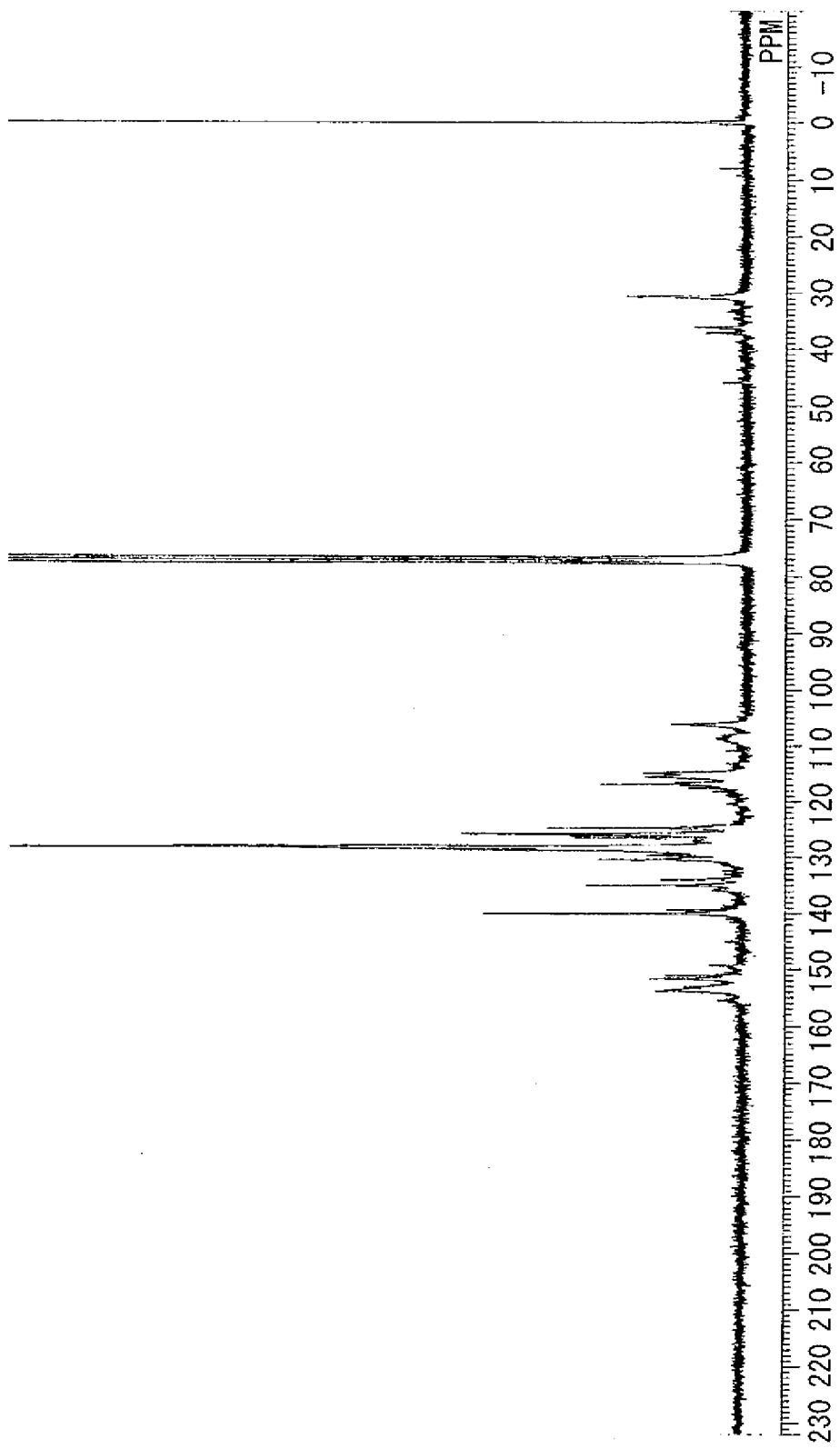
FIG. 1 is a graph showing a $^{13}$C-NMR spectrum of an aralkyl group-containing dihydroxy(polyoxynaphthlene) obtained in Example 1.
Figure 2:
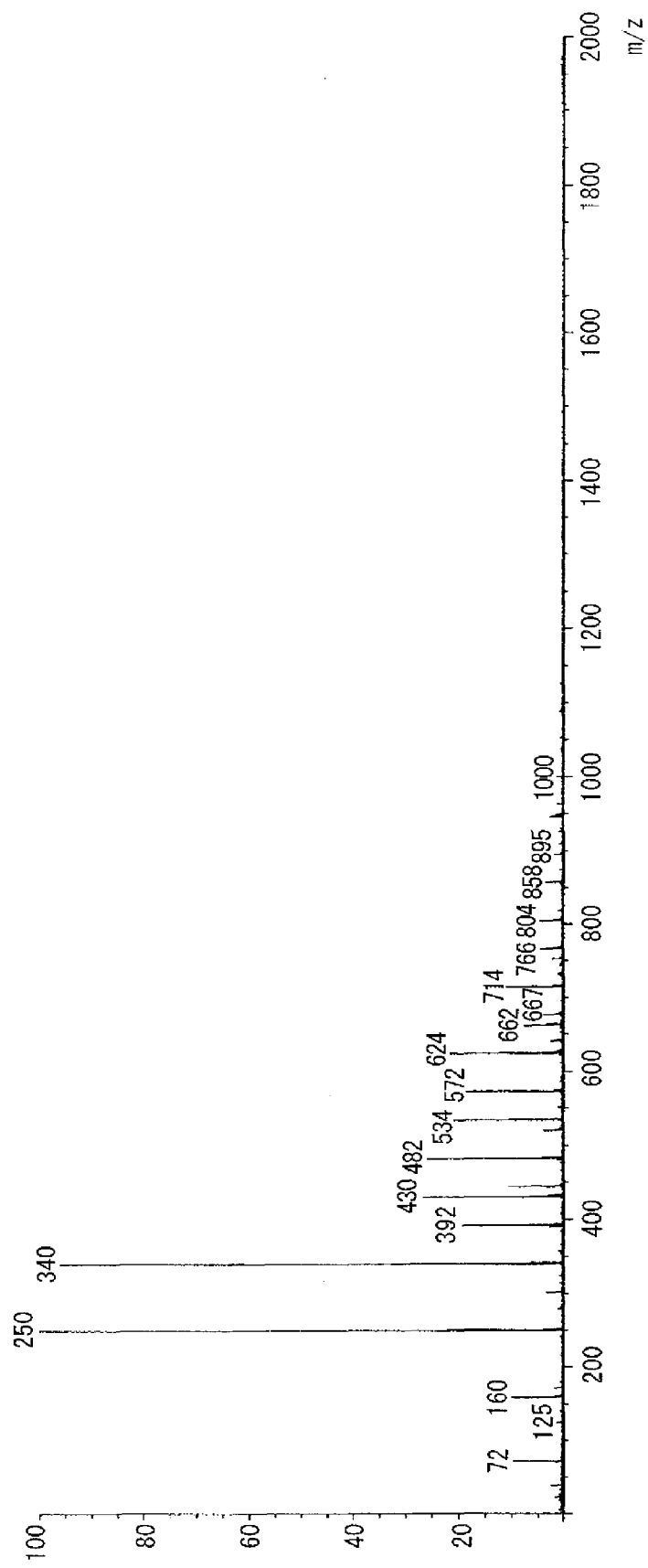
FIG. 2 is a graph showing a mass spectrum of an aralkyl group-containing dihydroxy(polyoxynaphthlene) obtained in Example 1.
Figure 3:
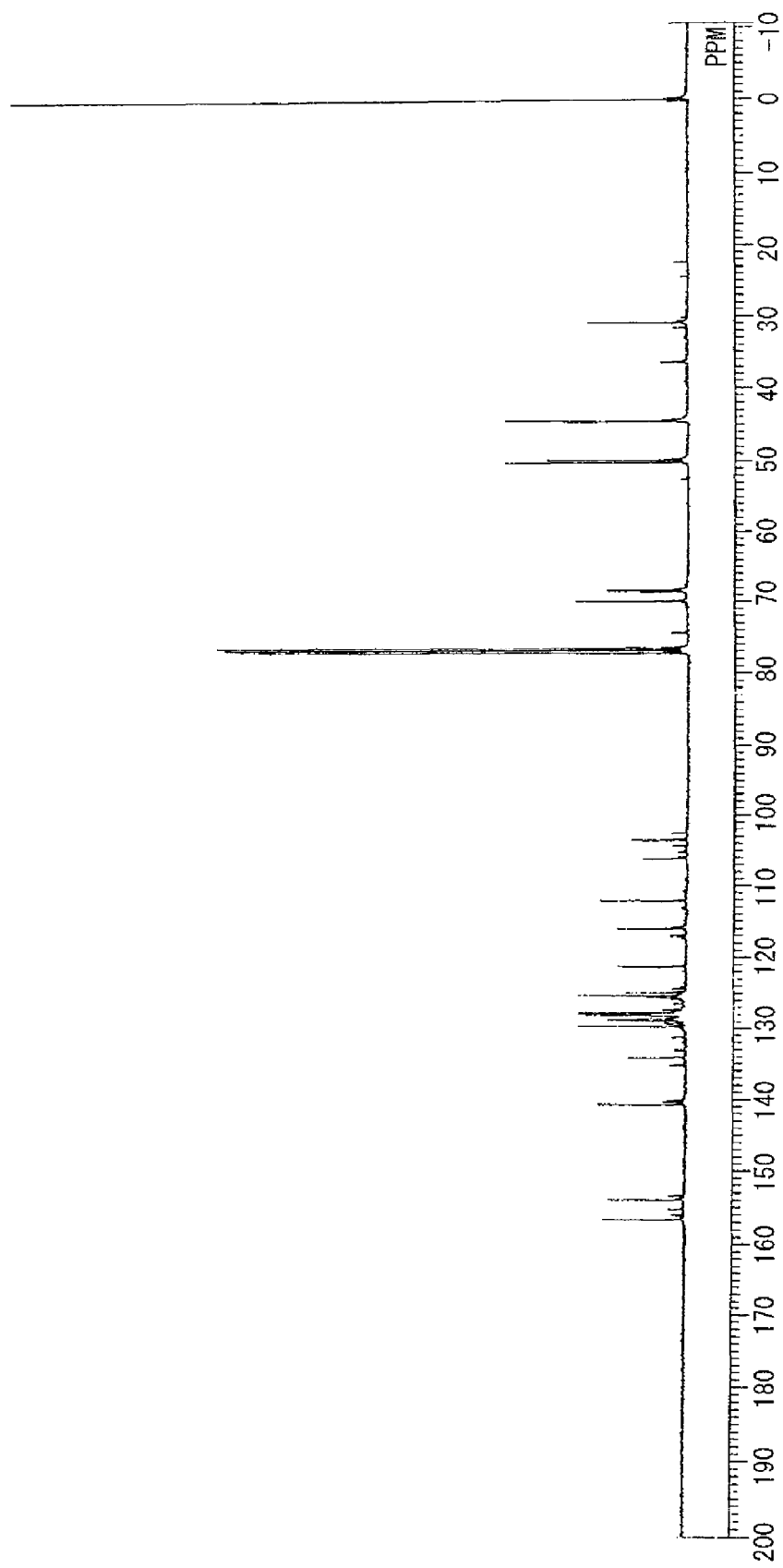
FIG. 3 is a graph showing a $^{13}$C-NMR spectrum of an aralkyl-modified poly(oxynaphthalene) type epoxy resin obtained in Example 2.
Figure 4:
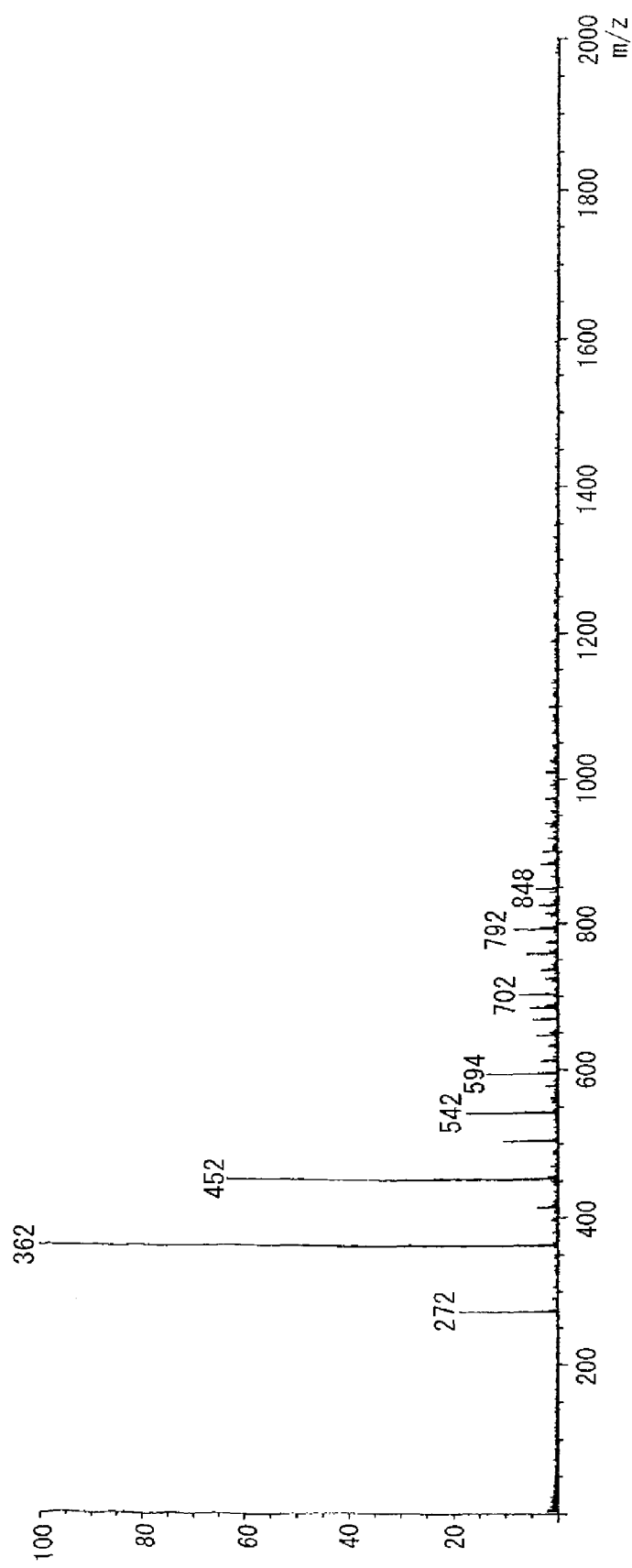
FIG. 4 is a graph showing a mass spectrum of an aralkyl-modified poly(oxynaphthalene) type epoxy resin obtained in Example 2.
Figure 5:
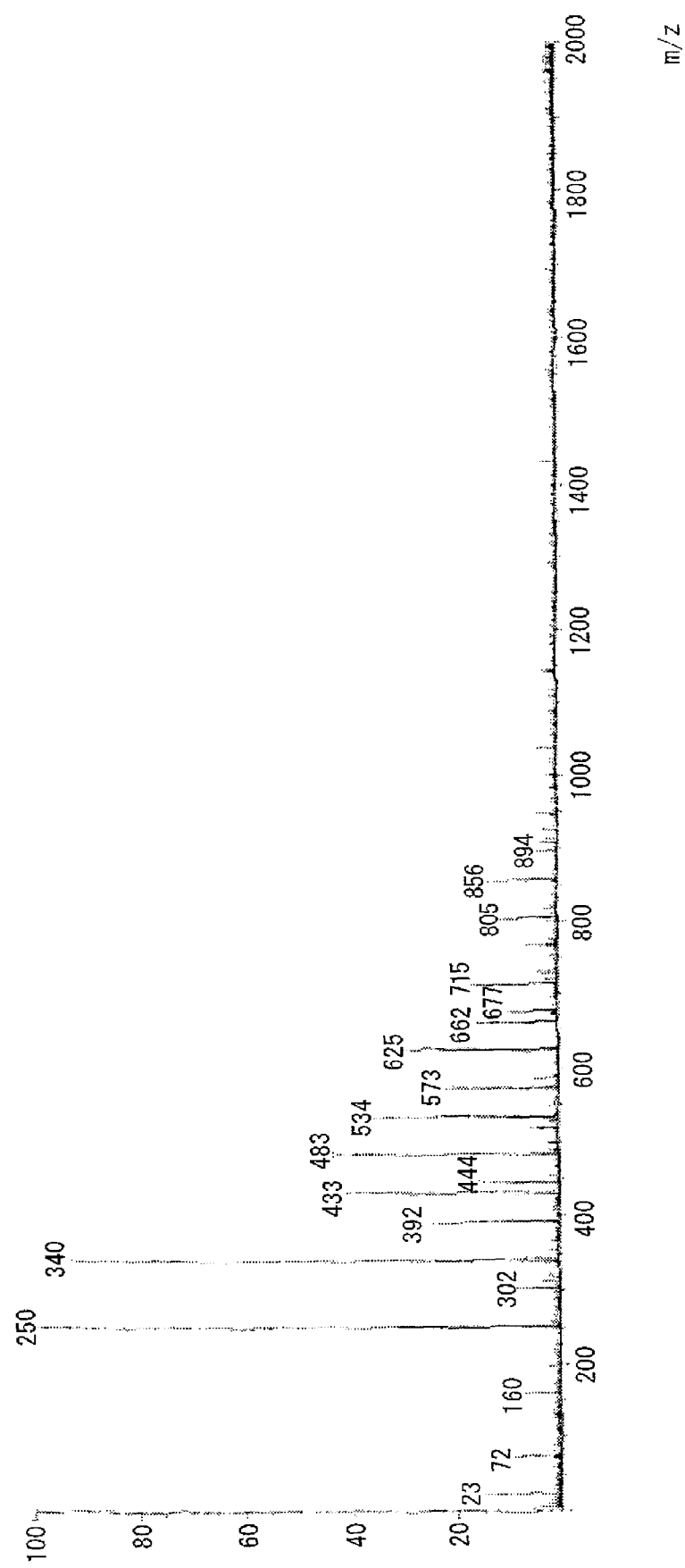
FIG. 5 is a graph showing a mass spectrum of an aralkyl group-containing dihydroxy(polyoxynaphthlene) obtained in Example 5.
Figure 6:
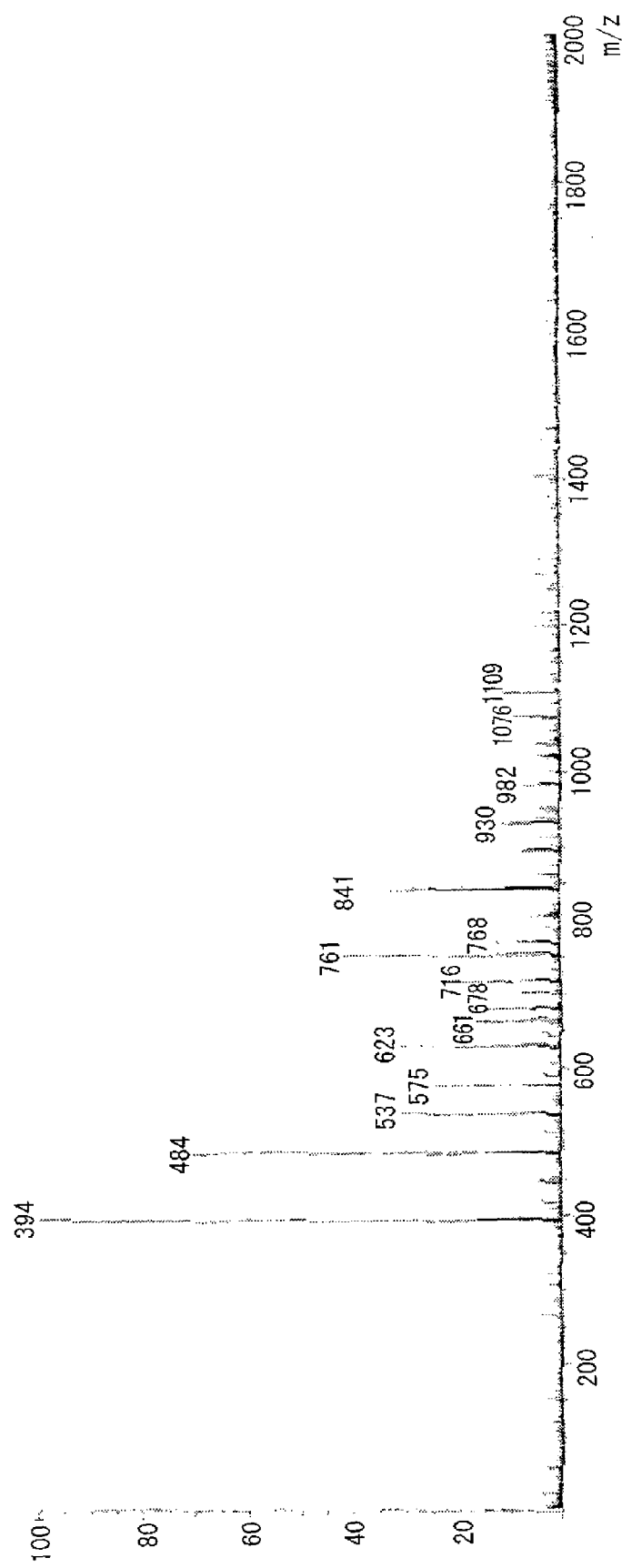
FIG. 6 is a graph showing a FD-MS spectrum by a trimethylsilylation method of an aralkyl group-containing dihydroxy(polyoxynaphthlene) obtained in Example 5.
Figure 7:
FIG. 7 is a graph showing a mass spectrum of an aralkyl group-containing dihydroxy(polyoxynaphthlene) obtained in Example 7.
Figure 8:
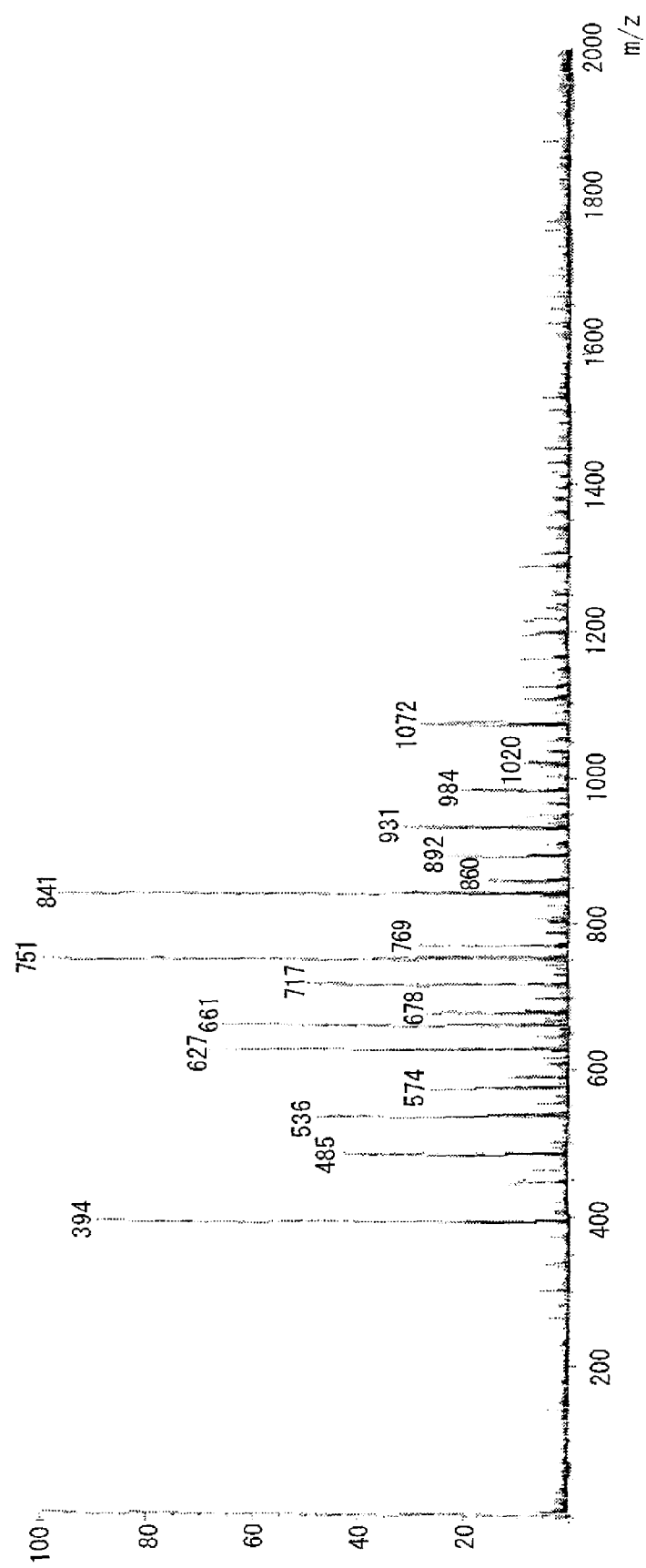
FIG. 8 is a graph showing a FD-MS spectrum by a trimethylsilylation method of an aralkyl group-containing dihydroxy(polyoxynaphthlene) obtained in Example 7.
Figure 9:
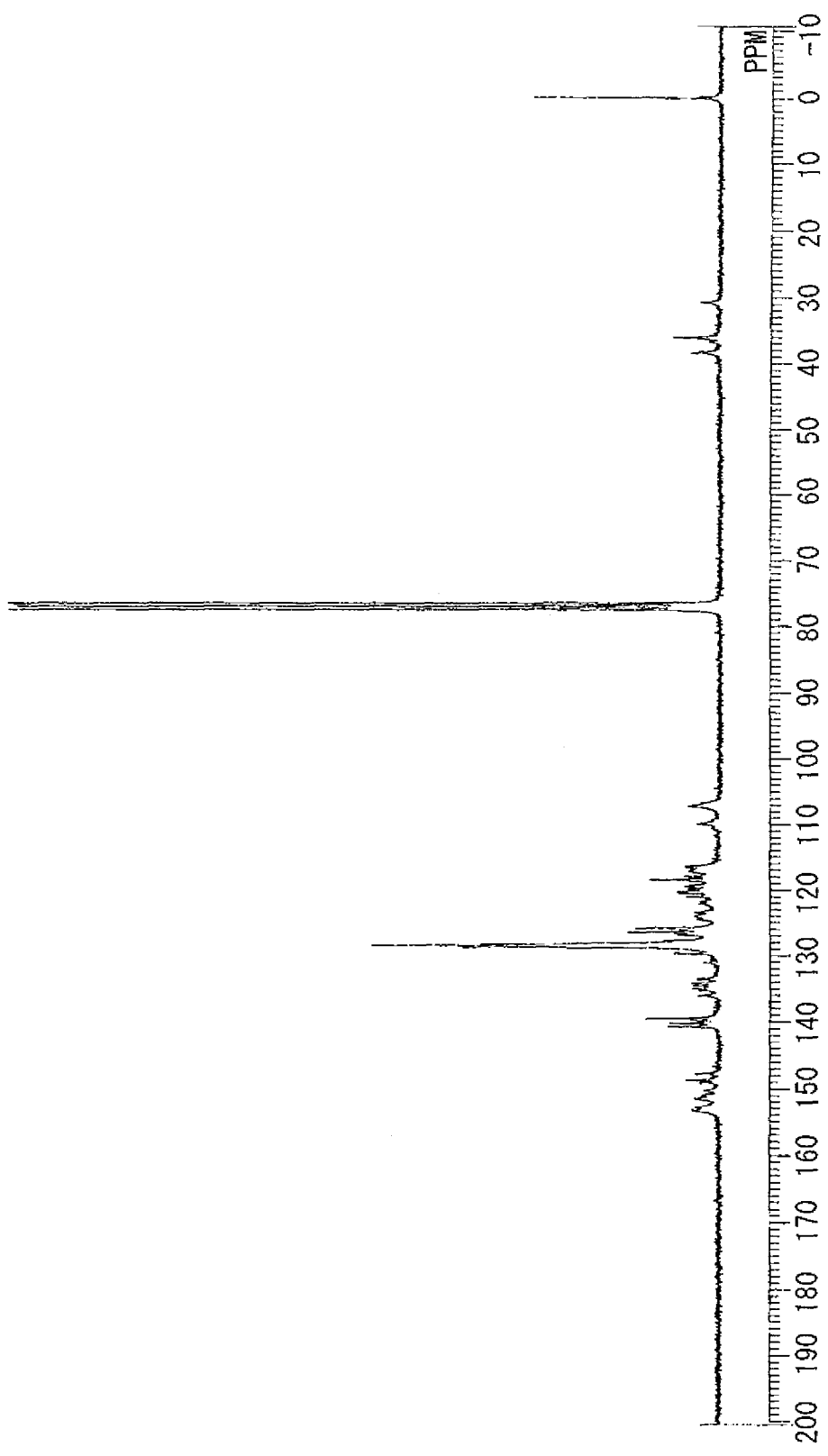
FIG. 9 is a graph showing a $^{13}$C-NMR spectrum of an aralkyl group-containing dihydroxy(polyoxynaphthlene) obtained in Example 9.
Figure 10:
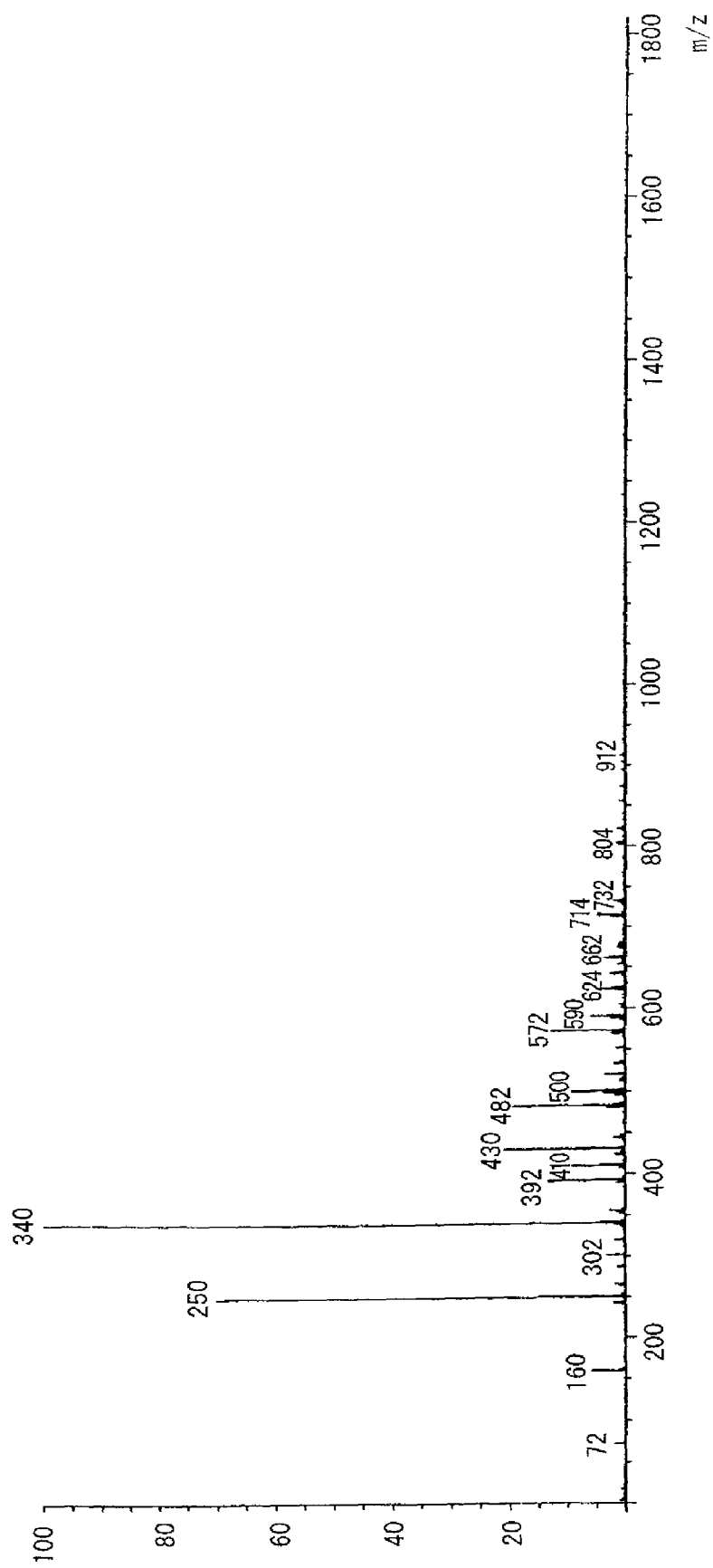
FIG. 10 is a graph showing a mass spectrum of an aralkyl group-containing dihydroxy(polyoxynaphthlene) obtained in Example 9.
Figure 11:
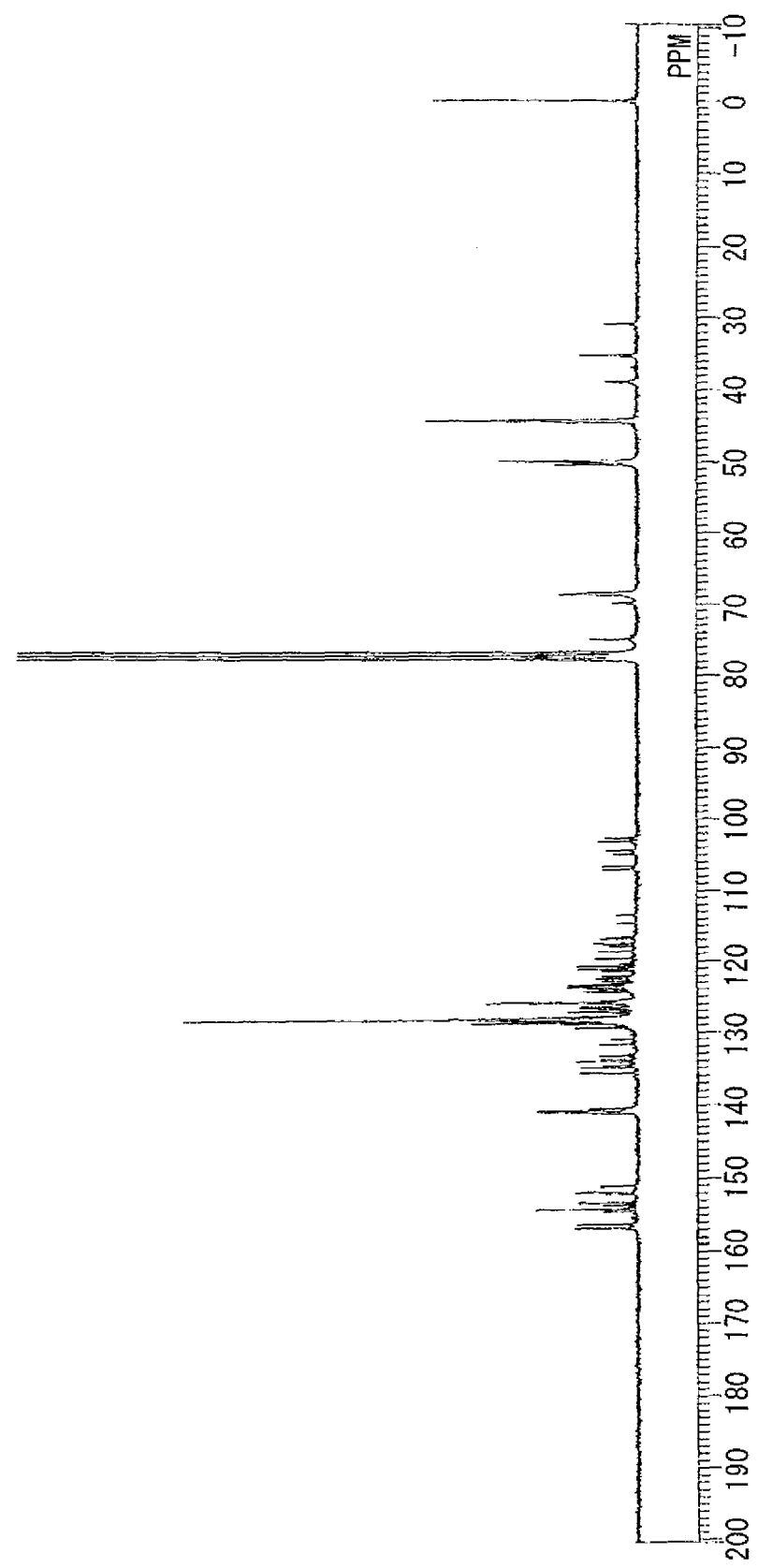
FIG. 11 is a graph showing a $^{13}$C-NMR spectrum of an aralkyl-modified poly(oxynaphthalene) type epoxy resin obtained in Example 10.
Figure 12:
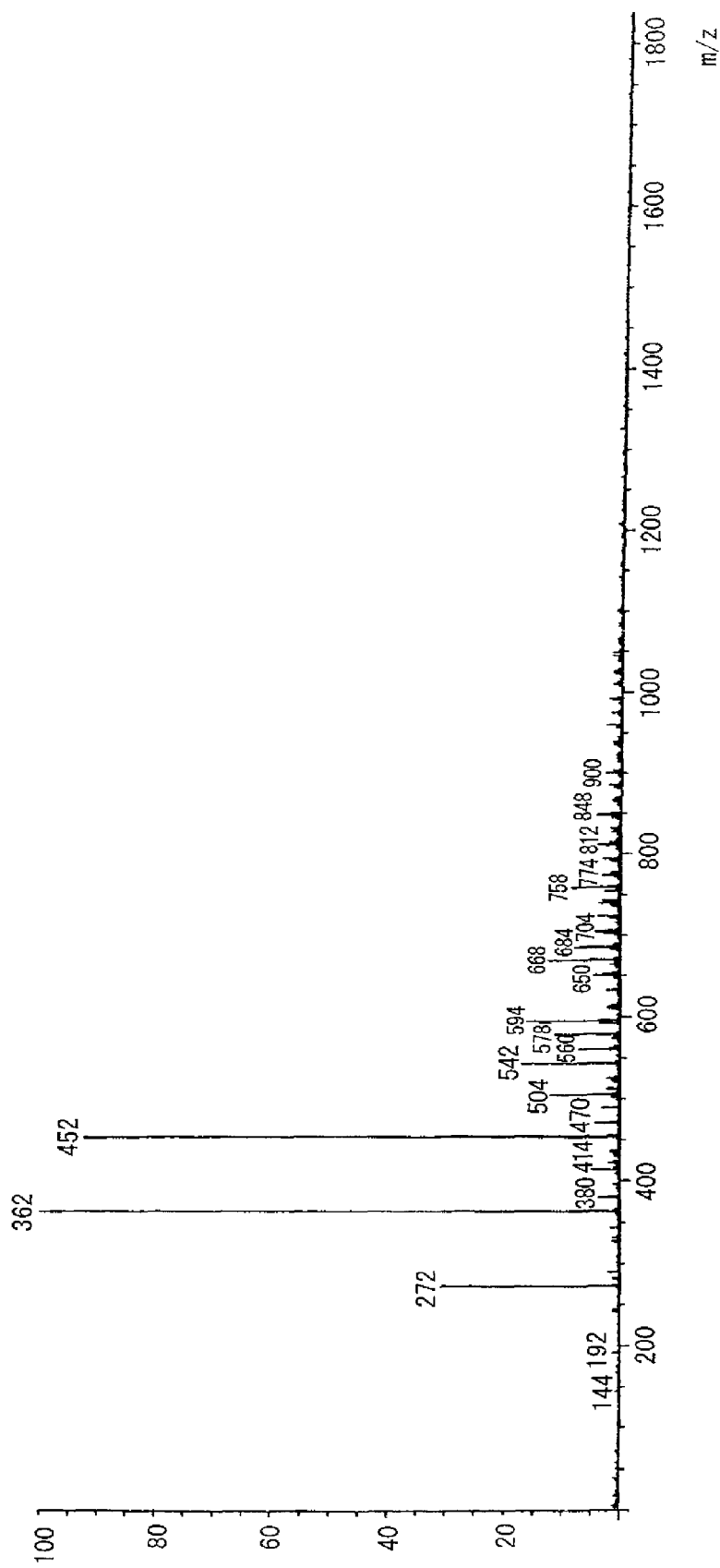
FIG. 12 is a graph showing a mass spectrum of an aralkyl-modified poly(oxynaphthalene) type epoxy resin obtained in Example 10.

The present invention will now be described in detail.

The epoxy resin (A) used in the epoxy resin composition (I) of the present invention has a molecular structure comprising a polyaryleneoxy structure as a main skeleton, a (methyl) glycidyloxy group and a structural segment represented by the following structural formula (1) being attached to an aromatic ring of the polyaryleneoxy structure

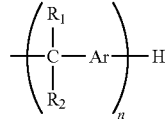

Structural formula (1)

in the formula (1), $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4.

Since the epoxy resin (A) has a polyarylene oxide structure as a main skeleton in the molecular structure, a char is rapidly formed by an arylene group in the structure and an aralkyl group represented by the structural formula (1) during combustion and excellent flame retardancy is exhibited. As described above, when a pendant-shaped aralkyl group is present in the epoxy resin structure, it becomes difficult to exert a flame retardant effect. Therefore, it is worthy of special mention to exhibit excellent flame retardancy by introducing the aralkyl group into the resin structure in the present invention. Furthermore, by introducing the structure represented by the structural formula (1) into the epoxy resin (A) of the present invention, the concentration of the (methyl)glycidyloxy group decreases and the dielectric constant of the cured article decreases. Therefore, the epoxy resin (A) can be provided with both excellent dielectric characteristics and flame retardant effect.

Examples of the polyarylene oxide structure constituting a basic skeleton of the epoxy resin (A) include naphthlene oxide-based structures such as polynaphthylene oxide structure, and polynaphthylene oxide structure which is substituted with an alkyl group having 1 to 4 carbon atoms; and phenylene oxide-based structures such as polyphenylene oxide structure, and polyphenylene oxide structure which is substituted with an alkyl group having 1 to 4 carbon atoms. In the present invention, those having a naphthlene oxide-based structure are particularly preferable because more remarkable flame retardant effect is exerted and also the dielectric dissipation factor decreases. In view of the flame retardant effect, a polynaphthylene oxide structure or a methyl group-containing polynaphthylene oxide structure is preferable and a polynaphthylene oxide structure is particularly preferable.

In the structural segment represented by the following structural formula (1) contained in the molecular structure of the epoxy resin (A),

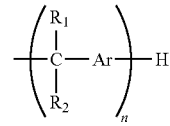

Structural formula (1)

$R_1$ and $R_2$ each independently represents methyl group or hydrogen atom, and Ar is a divalent aromatic hydrocarbon group selected from the group consisting of phenylene group, a phenylene group which is nuclear-substituted with 1 to 3 alkyl groups having 1 to 4 carbon atoms, naphthylene group, and a naphthylene group which is nuclear-substituted with 1 to 3 alkyl groups having 1 to 4 carbon atoms. Examples of the a phenylene group which is nuclear-substituted with 1 to 3 alkyl groups having 1 to 4 carbon atoms include methylphenylene group, ethylphenylene group, i-propylphenylene group and t-butylphenylene group, and examples of the a naphthylene group which is nuclear-substituted with 1 to 3 alkyl groups having 1 to 4 carbon atoms include methylnaphthylene group, ethylnaphthylene group, i-propylnaphthylene group and t-butylnaphthylene group. In the structural segment represented by the following structural formula (1), n is an average number of repeating units of 0.1 to 4.

Since materials are available with ease in the industrial production and the resulting cured article is excellent in flame retardancy and is also excellent in dielectric characteristics, both $R_1$ and $R_2$ are preferably hydrogen atoms. n is particularly preferably from 0.1 to 2 in view of flame retardant effect and dielectric characteristics. Since materials are available with ease and viscosity of the epoxy resin (A) decreases, Ar is preferably a phenylene group.

In the present invention, preferably, the divalent aromatic hydrocarbon group represented by "Ar" in the structural formula (1) is contained in the proportion of 0.1 to 4 per one molecule of the epoxy resin (A) because the flame retardant effect is remarkably improved.

Specific examples of the (methyl)glycidyloxy group in the molecular structure of the epoxy resin (A) include glycidyloxy group and β-methylglycidyloxy group. In the present invention, glycidyloxy group is preferable because the cured article is excellent in flame retardancy and materials are available with ease in the industrial production of the epoxy resin (A).

The epoxy resin (A) used in the present invention preferably has a melt viscosity at 150° C., as measured in accordance with "ASTM D4287", of 0.1 to 3.0 dPa·s in view of fluidity of the epoxy resin (A). When the epoxy resin (A) satisfies such a constituent feature, it can be employed as a novel epoxy resin of the present invention. When the epoxy resin (A) satisfies the melt viscosity conditions, fluidity of the resin itself is improved and it becomes easy to apply the epoxy resin composition containing the epoxy resin of the present invention to electronic components such as semiconductor encapsulating materials and underfill materials. It is worthy of a special mention that, when a dihydroxyaromatic compound is polyetherified by reacting in the presence of an acid catalyst, the molecular weight easily increases and it becomes difficult to apply to electronic components, on the other hand, according to the present invention, an increase in molecular weight is prevented by using in combination with an aralkylating agent when the dihydroxyaromatic compound is polyetherified, and thus it becomes possible to realize resin viscosity capable of applying to electronic components such as semiconductor encapsulating materials and underfil materials. Since balance between the fluidity and flame retardancy gets well, the melt viscosity is preferably within a range from 0.1 to 2.0 dPa·s, and more preferably from 0.1 to 1.5 dPa·s.

When the phenol resin as a precursor of the epoxy resin (A) is produced, a polyarylene oxide structure is preferably formed by using a dihydroxyaromatic compound as its starting material. In this case, since a phenolic hydroxyl group is formed at both ends of a linear molecular structure, a bifunctional epoxy resin is mainly obtained. Since the resin component includes those obtained by epoxidating a polyfunctional phenol resin having a molecular structure in which a naphthalene ring in the polynaphthylene oxide structure is partially attached directly to the other hydroxynaphthalene ring, the epoxy resin (A) is usually obtained as a polyfunctional epoxy resin. Here, when the epoxy resin (A) is used for electronic components, dielectric characteristics and moisture resistance are preferably more improved by further decreasing the concentration of the functional group in the epoxy resin, while fluidity is lowered when the molecular weight of the epoxy resin (A) increases excessively. Therefore, the epoxy resin (A) preferably has an epoxy equivalent within a range from 200 to 1,000 g/eq., and particularly preferably from 200 to 400 g/eq.

The epoxy resin (A) described above in detail preferably has a polynaphthyleneoxy structure as the polyarylene oxide structure and can be represented by the following general formula (1).

General formula (1)

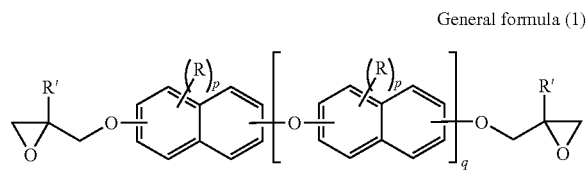

In the general formula (1), q represents an integer of 1 to 7, and p(s) each independently represents an integer of 0 to 4. With respect to at least one of R(s) in the general formula (1), p is within a range from 1 to 4. R' represents hydrogen atom or methyl group, and R(s) each independently represents the following general formula (2):

General formula (2)

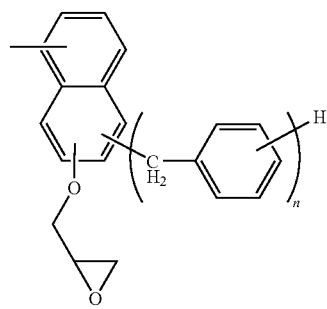

in the general formula (2), n represents an average value of repeating units of 0.1 to 4, or the following general formula (3):

General formula (3)

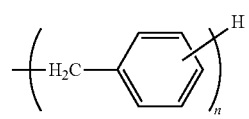

in the general formula (3), n represents an average value of repeating units of 0.1 to 4.

In the general formula (1), q is preferably an integer of 1 to 3 because fluidity of the epoxy resin (A) is improved. In view of flame retardancy and ease of the production of an epoxy resin, R' is preferably hydrogen atom. In the general formula (1), the bonding site to the naphthalene skeleton may be any of two rings constituting the naphthalene ring.

Specific examples of the epoxy resin represented by the general formula (1)

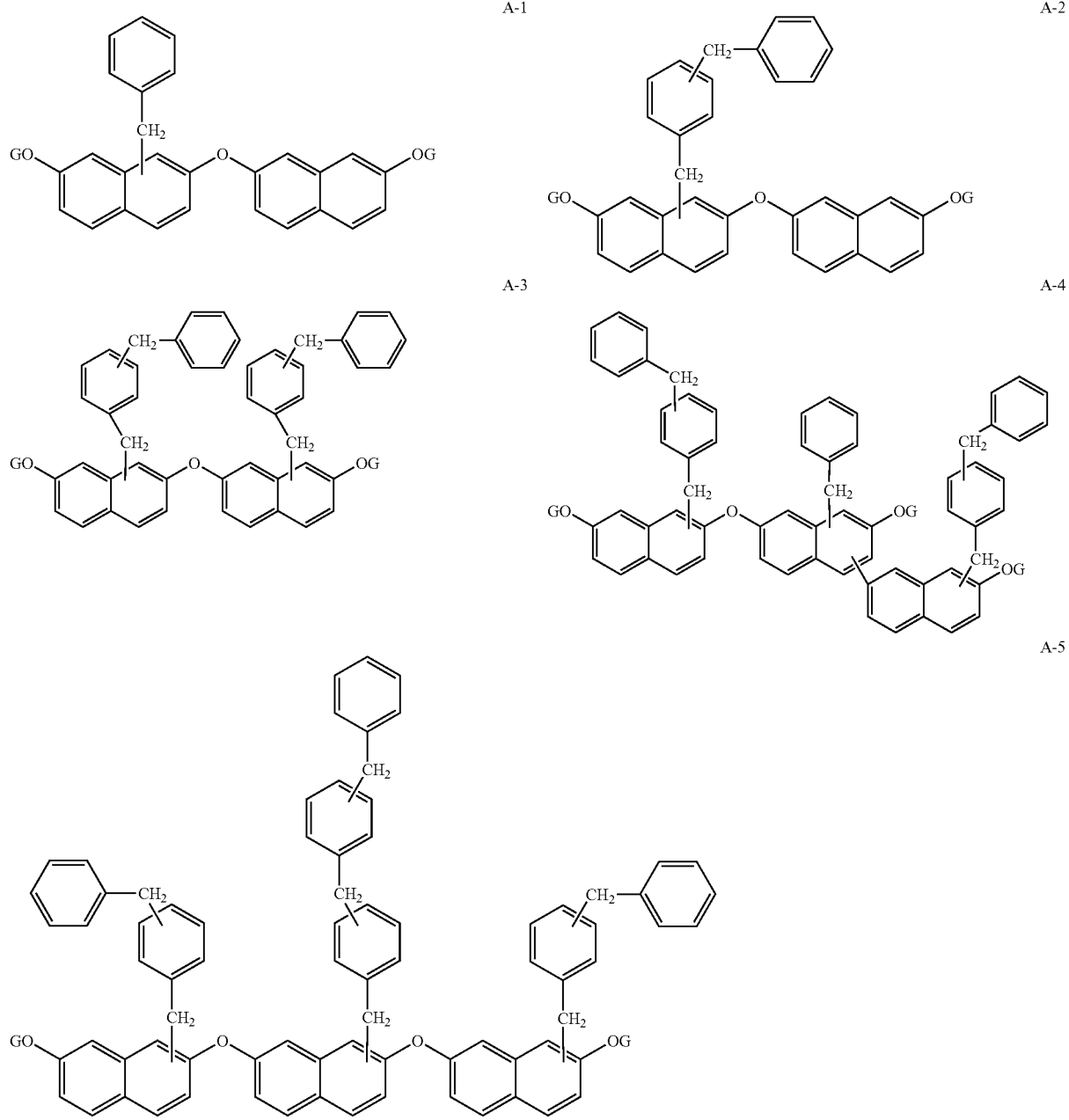

include those represented by the following structural formulas.

In the structural formulas (A-1) to (A-5), G represents glycidyl group, and a methylene bond attached to the naphthalene skeleton may be attached to any of two rings constituting the naphthalene ring.

As described above, in the present invention, it is possible to employ a structure as shown in the structural formula (A-4) in which the naphthalene ring in the polynaphthylene oxide structure is directly attached to the other naphthalene ring to form a branched structure and furthermore, an aralkyl group is introduced into a naphthalene ring introduced by this direct bond.

As described above, in the present invention, an active amount of the aralkyl group corresponding to the structural formula (1) must be present in the compound represented by the general formula (1). When the amount of the aralkyl group is too large, the effect of improving flame retardancy tends to be lowered. On the other hand, when q is too large, fluidity is lowered. Therefore, it is preferred that the compound represented by the general formula (1) has 0.1 to 4 divalent aromatic hydrocarbon groups represented by "Ar" in the general formula (1) per one molecule of the epoxy resin (A) and q is within a range from 1 to 4 because of excellent balance between these performances.

The epoxy resin (A) described above in detail can be produced by a method comprising the steps of previously extending molecular chains by the dehydrative etherification reaction using a dihydroxynaphthalene compound and reacting with an aralkylating agent described hereinafter, thereby to introduce a substituent into a naphthalene ring, followed by glycidyl etherification. However, in this case, as described above, since melt viscosity of the epoxy resin (A) increases, the epoxy resin is preferably produced by the following method for producing an epoxy resin of the present invention so as to secure proper melt viscosity of the epoxy resin (A).

The method for producing an epoxy resin of the present invention will now be described in detail.

The method for producing an epoxy resin of the present invention comprises the steps of:

reacting a dihydroxyaromatic compound (a1) with an aralkylating agent (a2) selected from a compound represented by the following structural formula (2):

Structural formula (2)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and Y represents a halogen atom, an alkoxy group or hydroxyl group, and a compound represented by the following structural formula (3):

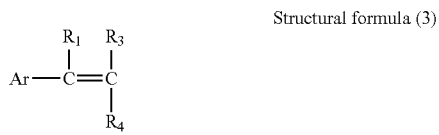

Structural formula (3)

wherein $R_1$, $R_3$ and $R_4$ each independently represents methyl group or hydrogen atom, and Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, in the presence of an acid catalyst to obtain a phenol resin (hereinafter, this step is abbreviated to "step 1"), and reacting the resulting phenol resin with epihalohydrins (a3) (hereinafter, this step is abbreviated to "step 2").

In the present invention, in the step 1, by reacting the dihydroxyaromatic compound (a1) with the aralkylating agent (a2) in the presence of an acid catalyst, there can be obtained a phenol resin having a structure comprising a polyarylene structure as a main skeleton and having a phenolic hydroxyl group at both terminal ends, an aralkyl group being attached on an aromatic nucleus of the polyarylene structure in the form of a pendant. It is worthy of special mention that, when a dihydroxyaromatic compound (a1) is allylene-etherified in the presence of an acid catalyst, as described above, it is very difficult to adjust the molecular weight and a high molecular polyallylene oxide is produced, on the other hand, according to the present invention, an increase in molecular weight is prevented by using in combination with an aralkylating agent (a2), and thus it becomes possible to obtain a resin which can be applied to semiconductor encapsulating materials.

In the present invention, by adjusting the amount of the aralkylating agent (a2), the content of the aralkyl group in the objective phenol resin can be adjusted and also melt viscosity of the phenol resin can be adjusted. Regarding a reaction ratio of the dihydroxyaromatic compound (a1) to the aralkylating agent (a2), a reaction ratio of the dihydroxyaromatic compound (a1) to the aralkylating agent (a2), (a1)/(a2), can be selected within a range from 1/0.1 to 1/10 in a molar ratio. In the present invention, as the amount of the aralkylating agent (a2) decreases, the mass of the polyarylene oxide structural moiety increases, and thus flame retardancy of the phenol resin is more improved. Therefore, the reaction ratio of the dihydroxyaromatic compound (a1) to the aralkylating agent (a2), (a1)/(a2), is preferably within a range from 1/0.1 to 1/1.0 in terms of a molar ratio. In case of reacting at a reaction ratio within the above range, the melt viscosity at 150° C., as measured in accordance with "ASTM D4287", of the phenol resin is within a range from 0.1 to 4.0 dPa·s.

Examples of the dihydroxyaromatic compound (a1), which can be used herein, include divalent phenols such as catechol, resorcinol and hydroquinone; and dihydroxynaphthalenes such as 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene and 2,7-dihydroxynaphthalene. Since the resulting phenol resin or a cured article of an epoxy resin obtained by epoxidating the phenol resin is excellent in flame retardancy and also the dielectric dissipation factor of the cured article decreases and dielectric characteristics are improved, dihydroxynaphthalenes are preferable, and 1,6-dihydroxynaphthalene or 2,7-dihydroxynaphthalene is more preferable and 2,7-dihydroxynaphthalene is particularly preferable.

Among the aralkylating agents (a2), examples of the compound represented by the following structural formula (2):

Structural formula (2)

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and Y represents a halogen atom, include benzyl chloride, benzyl bromide, benzyl iodide, o-methylbenzyl chloride, m-methylbenzyl chloride, p-methylbenzyl chloride, p-ethylbenzyl chloride, p-isopropylbenzyl chloride, p-tert-butylbenzyl chloride, p-phenylbenzyl chloride, 5-chloromethyl acenaphthylene, 2-naphthylmethylchloride, 1-chloromethyl-2-naphthalene and nuclear-substituted isomers thereof, α-methylbenzyl chloride, and α,α-dimethylbenzyl chloride.

When Y is an alkoxy group, the alkoxy group has preferably 1 to 4 carbon atoms, and examples of the compound represented by the structural formula (2) include benzyl methyl ether, o-methyl benzyl methyl ether, m-methyl benzyl methyl ether, p-methyl benzyl methyl ether, p-ethyl benzyl methyl ether and nuclear-substituted isomers thereof, benzyl ethyl ether, benzyl propyl ether, benzyl isobutyl ether, benzyl n-butyl ether, p-methyl benzyl methyl ether and nuclear-substituted isomers thereof.

When Y is hydroxyl group, examples of the compound represented by the structural formula (2) include benzyl alcohol, o-methylbenzyl alcohol, m-methylbenzyl alcohol, p-methylbenzyl alcohol, p-ethylbenzyl alcohol, p-isopropylbenzyl alcohol, p-tert-butylbenzyl alcohol, p-phenylbenzyl alcohol, α-naphthyl carbinol and nuclear-substituted isomers thereof, α-methylbenzyl alcohol and α,α-dimethylbenzyl alcohol.

Among the aralkylating agents (a2), examples of the compound represented by the following structural formula (3):

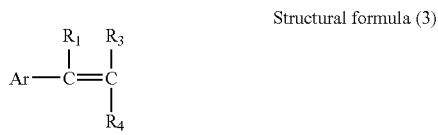

Structural formula (3)

include styrene, o-methylstyrene, m-methylstyrene, p-methylstyrene, α-methylstyrene and β-methylstyrene.

Among these, the aralkylating agent represented by the structural formula (2) is preferable in view of the flame retardant effect, and benzyl chloride, benzyl bromide and benzyl alcohol are particularly preferable because more remarkable flame retardant effect is exerted in the cured article of the finally obtained epoxy resin or phenol resin.

Examples of the acid catalyst, which can be used in the reaction between the dihydroxyaromatic compound (a1) and the aralkylating agent (a2) in the step 1, include inorganic acids such as phosphoric acid, sulfuric acid and hydrochloric acid; organic acids such as oxalic acid, benzenesulfonic acid, toluenesulfonic acid, methanesulfonic acid and fluoromethanesulfonic acid; and Friedel-Crafts catalysts such as aluminum chloride, zinc chloride, stannic chloride, ferric chloride and diethylsulfuric acid.

The amount of the above acid catalyst can be appropriately selected according to the target modification rate. In case of the inorganic acid and organic acid, the amount is preferably within a range from 0.001 to 5.0 parts by mass, and preferably from 0.01 to 3.0 parts by mass, based on 100 parts by mass of the dihydroxyaromatic compound (a1). In case of the Friedel-Crafts catalyst, the amount is preferably within a range from 0.2 to 3.0 mols, and preferably from 0.5 to 2.0 mols, based on 1 mol of the dihydroxyaromatic compound (a1).

The reaction between the dihydroxyaromatic compound (a1) and the aralkylating agent (a2) in the step 1 may be conducted in the absence of a solvent, or may be conducted in the presence of a solvent so as to enhance uniformity in the reaction system. Examples of the solvent include mono- or diethers of ethylene glycol and diethylene glycol, such as ethylene glycol dimethyl ether, ethylene glycol diethyl ether, ethylene glycol dipropyl ether, diethylene glycol dimethyl ether, diethylene glycol diethyl ether, diethylene glycol dipropyl ether, ethylene glycol monomethyl ether, ethylene glycol monoethyl ether, ethylene glycol monopropyl ether, diethylene glycol monomethyl ether, diethylene glycol monoethyl ether, diethylene glycol monopropyl ether and diethylene glycol monobutyl ether; aprotic polar solvents such as dimethyl formamide and dimethyl sulfoxide; and chlorobenzene.

Specifically, the reaction of the step 1 can be conducted in the absence of a solvent, or conducted by dissolving a dihydroxyaromatic compound (a1), an aralkylating agent (a2) and the acid catalyst in the solvent at a temperature within a range from about 60 to 180° C., and preferably from about 80 to 160° C. The reaction time is not specifically limited and is preferably from 1 to 10 hours. Therefore, the reaction can be conducted by maintaining the temperature for 1 to 10 hours. The hydrogen halide, water or alcohols produced during the reaction are preferably removed out of the system using a distilling tube because the reaction quickly proceeds and productivity is improved.

When the resulting dihydroxynaphthalene compound shows high degree of coloration, antioxidants and reducing agents may be added to the reaction system so as to suppress coloration. Examples of the antioxidant include hindered phenolic compounds such as 2,6-dialkylphenol derivative; divalent sulfur-based compounds; and phosphite ester-based compounds containing a trivalent phosphorus atom. Examples of the reducing agent include hypophosphorous acid, phosphorous acid, thiosulfuric acid, sulfurous acid, hydrosulfite, or salts thereof.

After the completion of the reaction, the objective phenol resin can be separated by removing an acid catalyst using a neutralization, washing or decomposition treatment and subjecting to a conventional operation such as extraction or distillation. The neutralization or washing treatment may be conducted by a conventional method. For example, basic substances such as sodium hydroxide, potassium hydroxide, sodium carbonate, ammonia, triethylenetetramine and aniline can be used as a neutralizer.

In the step 2, the objective epoxy resin can be obtained by reacting the phenol resin obtained in the step 1 with epihalohydrins (a3). In the reaction of the step 2, there can be employed a method of adding 2 to 10 mols of epihalohydrins (a3) to 1 mol of a phenolic hydroxyl group in the phenol resin and reacting at a temperature of 20 to 120° C. for 0.5 to 10 hours while simultaneously or gradually adding 0.9 to 2.0 mols of a basic catalyst to 1 mol of the phenolic hydroxyl group in the phenol resin.

The basic catalyst may be used herein in the form of a solid or an aqueous solution. When the basic catalyst in the form of the aqueous solution, there can be used a method of continuously adding the aqueous solution, continuously distilling off water and epihalohydrins (a3) from the reaction mixture under reduced pressure or normal pressure, separating them, removing water and continuously returning epihalohydrins (a3) into the reaction mixture.

Examples of the epihalohydrin (a3) include epichlorohydrin, epibromohydrin and β-methylepichlorohydrin. Among these epihalohydrins, epichlorohydrin is preferable because it is available with ease. In case of industrial production, it is preferred to use epihalohydrins (a3) recovered from the crude reaction product in combination with new epihalohydrins (a3) corresponding the epihalohydrins consumed during the reaction, in the reaction in the following batches after the completion of the reaction of an initial batch for the production of an epoxy resin.

Specific examples of the basic catalyst include alkali earth metal hydroxide, alkali metal carbonic acid salt and alkali metal hydroxide. In view of excellent catalytic activity of the reaction for synthesis of an epoxy resin, alkali metal hydroxide is preferable and examples thereof include sodium hydroxide and potassium hydroxide. These basic catalysts may be used in the form of an aqueous solution having a concentration of about 10 to 55% by mass or a solid. The reaction rate in the synthesis of an epoxy resin can be increased by using in combination with an organic solvent. Examples of the organic solvent include, but are not limited to, ketones such as acetone and methyl ethyl ketone; alcohols such as methanol, ethanol, 1-propyl alcohol, isopropyl alcohol, 1-butanol, secondary butanol and tertiary butanol; cellosolves such as methyl cellosolve and ethyl cellosolve; ethers such as tetrahydrofuran, 1,4-dioxane, 1,3-dioxane and diethoxyethane; and aprotic polar solvents such as acetonitrile, dimethyl sulfoxide and dimethyl formamide. These organic solvent may be used alone, or may be used in combination so as to adjust polarity.

The reaction product of the above epoxydation reaction is washed with water and then the unreacted epihalohydrin and the organic solvent used in combination are distilled off by distillation with heating under reduced pressure. To obtain an epoxy resin containing a small amount of a hydrolyzable halogen, the resulting epoxy resin is dissolved in an organic solvent such as toluene, methyl isobutyl ketone or methyl ethyl ketone and an aqueous solution of an alkali metal hydroxide such as sodium hydroxide or potassium hydroxide is added and then the reaction can be further conducted. For the purpose of improving the reaction rate, the reaction can be conducted in the presence of a phase transfer catalyst such as quaternary ammonium salt or crown ether. In case of using the phase transfer catalyst, the amount is preferably within a range from 0.1 to 3.0% by mass based on the amount of the epoxy resin to be used. After the completion of the reaction, the resulting salt is removed by filtration or washing with water, and then the solvent such as toluene or methyl isobutyl ketone is distilled off with heating under reduce pressure to obtain a high-purity epoxy resin.

In the epoxy resin composition (I) of the present invention, the epoxy resin (A) obtained by the method of the present invention can be used alone or in combination with the other epoxy resin as far as the effects of the present invention are not adversely affected. When using in combination, the content of the epoxy resin (A) of the present invention is preferably 30% by mass or more, and particularly preferably 40% by mass or more, based on the entire epoxy resin.

As the other epoxy resin which can be used in combination, various epoxy resins can be used. Examples thereof include bisphenol A type epoxy resin, bisphenol F type epoxy resin, biphenyl type epoxy resin, tetramethylbiphenyl type epoxy resin, phenol novolak type epoxy resin, cresol novolak type epoxy resin, triphenylmethane type epoxy resin, tetraphenylethane type epoxy resin, dicyclopentadiene-phenol addition reaction type epoxy resin, phenol aralkyl type epoxy resin, naphthol novolak type epoxy resin, naphthol aralkyl type epoxy resin, naphthol-phenol condensed novolak type epoxy resin, naphthol-cresol condensed novolak type epoxy resin, aromatic hydrocarbon formaldehyde resin-modified phenol resin type epoxy resin and biphenyl-modified novolak type epoxy resin. Among these epoxy resins, a tetramethyl biphenyl type epoxy resin, a biphenyl aralkyl type epoxy resin and a novolak type epoxy resin are particularly preferable because a cured article having excellent flame retardancy can be obtained.

As the curing agent (B) used in the epoxy resin composition (I) of the present invention, known various curing agents for epoxy resin such as amine-based compounds, amide-based compounds, acid anhydride-based compounds and phenol-based compounds can be used. Specific examples of the amine-based compound include diaminodiphenylmethane, diethylenetriamine, triethylenetetramine, diaminodiphenylsulfon, isophoronediamine, imidazol, $BF_3$-amine complex and guanidine derivative; specific examples of the amide-based compound include dicyandiamide, and polyamide resin synthesized from a dimer of linolenic acid and ethylenediamine; specific examples of the acid anhydride-based compound include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride and methylhexahydrophthalic anhydride; and specific examples of the phenol-based compound include polyvalent phenol compounds such as phenol novolak resin, cresol novolak resin, aromatic hydrocarbon formaldehyde resin-modified phenol resin, dicyclopentadienephenol addition type resin, phenol aralkyl resin, naphthol aralkyl resin, trimethylolmethane resin, tetraphenylolethane resin, naphthol novolak resin, naphthol-phenol condensed novolak resin, naphthol-cresol condensed novolak resin, biphenyl-modified phenol resin (polyvalent phenol compound in which a phenol nucleus is combined through a bismethylene group), biphenyl-modified naphthol resin (polyvalent naphthol compound in which a phenol nucleus is combined through a bismethylene group), aminotriazine-modified phenol resin (polyvalent phenol compound in which phenol nucleus is combined through melamine or benzoguanamine).

Among these compounds, those containing a lot of aromatic skeletons in the molecular structure are preferable in view of the flame retardant effect and, for example, a phenol novolak resin, a cresol novolak resin, an aromatic hydrocarbon formaldehyde resin-modified phenol resin, a phenol aralkyl resin, a naphthol aralkyl resin, a naphthol novolak resin, a naphthol-phenol condensed novolak resin, a naphthol-cresol condensed novolak resin, a biphenyl-modified phenol resin, a biphenyl-modified naphthol resin and an aminotriazine-modified phenol resin are preferable because of excellent flame retardancy.

However, in the present invention, since flame retardancy is remarkably improved and excellent dielectric characteristics are inhibited, a phenol aralkyl resin, for example, a phenol resin having a structure in which plural phenols are linked via a structure, as a linking group, represented by the following structural formula (1) is preferable.

Structural formula (i)

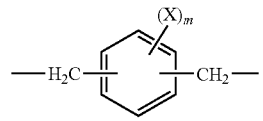

In the structural formula (1), X represents alkyl group having 1 to 4 carbon atom, or hydrogen atoms, and m represents an integer of 0 to 3.

The contents of the epoxy resin (A) and the curing agent (B) in the epoxy resin composition (I) of the present invention are preferable so that the content of an active group in the curing agent (B) is within a range from 0.7 to 1.5 equivalents based on 1 equivalent of the total of epoxy groups in the epoxy resin containing the epoxy resin (A) because the resulting cured article is excellent in mechanical properties.

Another epoxy resin composition (II) of the present invention comprises, as essential components, a phenol resin (B') having a molecular structure comprising a polyaryleneoxy structure as a main skeleton, a phenolic hydroxyl group and a structural segment represented by the following structural formula (1) being attached to an aromatic ring of the polyaryleneoxy structure Structural formula (1)

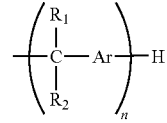

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and n represents an average number of repeating units of 0.1 to 4, and an epoxy resin (A').

The phenol resin (B') has the same structure as that of the phenol resin which is a precursor of the epoxy resin (A) in the epoxy resin composition (I). The melt viscosity at 150° C., as measured in accordance with "ASTM D4287", of the phenol resin (B') is preferably within a range from 0.1 to 4.0 dPa·s in view of fluidity of the resin itself. In this case, the phenol resin (B') is employed as a novel phenol resin of the present invention. In view of balance between flame retardant effect and fluidity, the melt viscosity at 150° C., as measured in accordance with "ASTM D4287" of the phenol resin (B') is preferably within a range from 0.1 to 3.0 dPa·s, and particularly preferably from 0.1 to 2.0 dPa·s.

Regarding functionality of a phenolic hydroxyl group of the phenol resin (B'), similar to the epoxy resin (A), a polyarylene oxide structure is preferably formed using a dihydroxyaromatic compound as the material. In this case, since a phenolic hydroxyl group is formed at both ends of a linear molecular structure, a bifunctional epoxy resin is mainly obtained. Since the resin component includes those obtained by epoxidating a polyfunctional phenol resin having a molecular structure in which a naphthalene ring in the polynaphthylene oxide structure is partially attached directly to the other hydroxynaphthalene ring, the phenol resin (B') is usually obtained as a polyfunctional phenol resin. Therefore, the phenol resin (B') preferably has a hydroxyl group equivalent within a range from 130 to 800 g/eq., and particularly preferably from 130 to 300 g/eq because of excellent effect of improving dielectric characteristics and moisture resistance after curing and excellent fluidity.

The phenol resin (B') having a polynaphthyleneoxy structure as the polyalkylene oxide structure is preferable because excellent flame retardant effect is exerted and the dielectric dissipation factor decreases, and can be represented by the following general formula (4).

General formula (4)

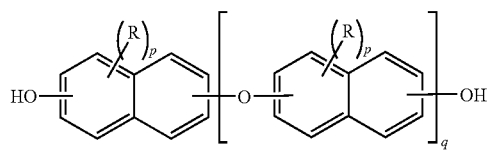

In the general formula (4), q represents an integer of 1 to 7, and p(s) each independently represents an integer of 0 to 4. With respect to at least one of R(s) in the general formula (4), p is within a range from 1 to 4. R(s) each independently represents the following general formula (5):

General formula (5)

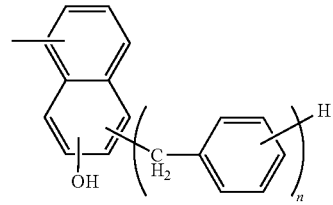

in the general formula (5), n represents an average value of repeating units of 0.1 to 4, or the following general formula (6):

General formula (6)

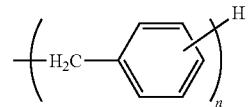

in the general formula (6), n represents an average value of repeating units of 0.1 to 4.

In the general formula (4), q is preferably an integer of 1 to 3 because fluidity of the epoxy resin (A) is improved. In the general formula (4), the bonding site to the naphthalene skeleton may be any of two rings constituting the naphthalene ring.

Specific examples of the phenol resin represented by the general formula (4) include those represented by the following structural formulas.

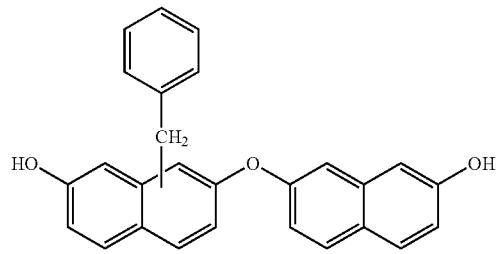

P-1

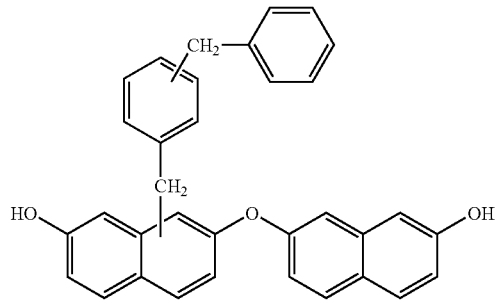

P-2

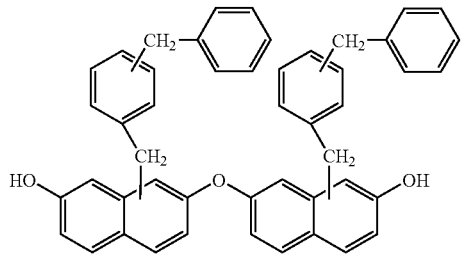

P-3

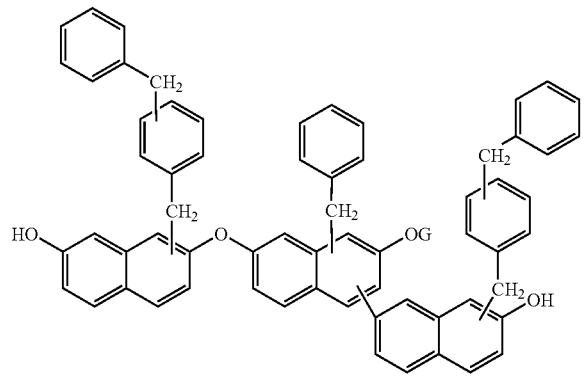

P-4

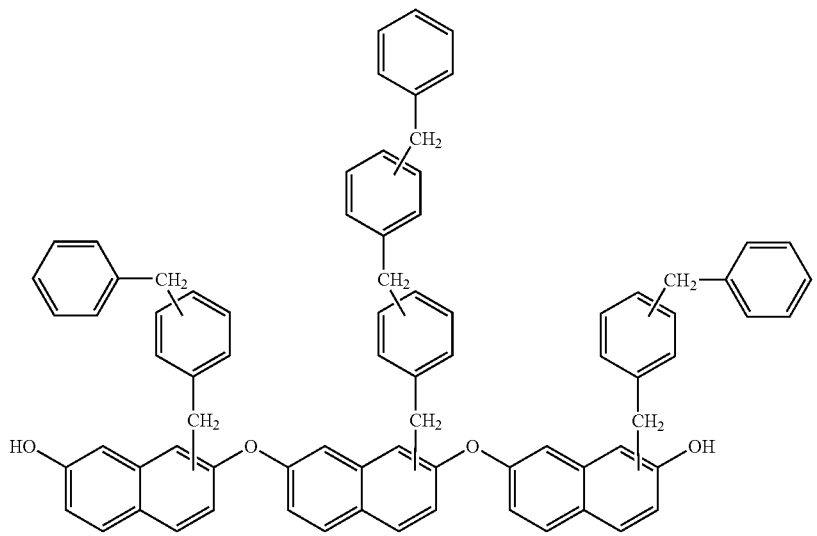

P-5

In the structural formulas (P-1) to (P-5), a methylene bond attached to a naphthalene skeleton may be attached to any of two rings constituting a naphthalene ring. As described above, in the present invention, it is possible to employ a structure as shown in the structural formula (P-4) in which the naphthalene ring in the polynaphthylene oxide structure is directly attached to the other naphthalene ring to form a branched structure and furthermore, an aralkyl group is introduced into a naphthalene ring introduced by this direct bond.

When the amount of the aralkyl group corresponding to the structural formula (1) is too large in the compound represented by the general formula (2), the effect of improving flame retardancy tends to be lowered. On the other hand, when q is large, flame retardancy is improved but fluidity is lowered. Therefore, it is preferred that the compound represented by the general formula (4) has 0.1 to 4 divalent aromatic hydrocarbon groups represented by "Ar" in the general formula (4) per one molecule of the epoxy resin (A) and q is within a range from 1 to 4 because of excellent balance between these performances.

The phenol resin (B') described above in detail can be produced by a method of the steps of previously extending molecular chains by the dehydrative etherification reaction using a dihydroxynaphthalene compound and reacting with an aralkylating agent described hereinafter, thereby to introduce a substituent into a naphthalene ring. However, as described above, since the dehydrative etherification reaction causes an excess increase of molecular weight to cause thickening according to this method, the phenol resin is preferably produced by the step 1 in the above-described method for producing an epoxy resin of the present invention.

In the epoxy resin composition (II) of the present invention, the phenol resin (B') may be used alone as a curing agent of the epoxy resin (A'), or used in combination with the other curing agent as far as the effects of the present invention are not adversely affected. Specifically, the other curing agent can be used in combination so that the content of the phenol resin is 30% by mass or more, and preferably 40% by mass or more, based on the total mass of the curing agent.

Examples of the other curing agent which can used in combination with the phenol resin (B') of the present invention include, but are not limited to, amine-based compounds, amide-based compounds, acid anhydride-based compounds, phenol-based compounds other than the above phenol resins (B'), and polyvalent phenol compounds of aminotriazine-modified phenol resins (polyvalent phenol compounds in which phenol nucleus are combined through melamine or benzoguanamine).

Among these, phenol novolak resin, cresol novolak resin, aromatic hydrocarbon formaldehyde resin-modified phenol resin, phenol aralkyl resin, naphthol alaralkyl resin, naphthol novolak resin, naphthol-phenol condensed novolak resin, naphthol-cresol condensed novolak resin, biphenyl-modified phenol resin, biphenyl-modified naphthol resin and aminotriazine-modified phenol resin are preferable because of excellent flame retardancy, and compounds, for example, phenol resins having high aromatic properties and high hydroxyl group equivalent such as phenol aralkyl resin, naphthol aralkyl resin, biphenyl-modified phenol resin and biphenyl-modified naphthol resin, and aminotriazine-modified phenol resins having a nitrogen atom are used particularly preferably because the resulting cured article is excellent in flame retardancy and dielectric characteristics.

Examples of the epoxy resin (A') used in the epoxy resin composition (II) of the present invention include bisphenol A type epoxy resin, bisphenol F type epoxy resin, biphenyl type epoxy resin, tetramethylbiphenyl type epoxy resin, phenol novolak type epoxy resin, cresol novolak type epoxy resin, bisphenol A novolak type epoxy resin, triphenylmethane type epoxy resin, tetraphenylethane type epoxy resin, dicyclopentadiene-phenol addition reaction type epoxy resin, phenol aralkyl type epoxy resin, naphthol novolak type epoxy resin, naphtholaralkyl type epoxy resin, naphthol-phenol condensed novolak type epoxy resin, naphthol-cresol condensed novolak type epoxy resin, aromatic hydrocarbon formaldehyde resin-modified phenol resin type epoxy resin and biphenyl novolak type epoxy resin. These epoxy resins may be used alone or in combination.

Among these epoxy resins, biphenyl type epoxy resin, naphthalene type epoxy resin, phenol aralkyl type epoxy resin, biphenyl novolak type epoxy resin and xanthene type epoxy resin are particularly preferable because of excellent flame retardancy and dielectric characteristics.

The contents of the epoxy resin (A') and the curing agent in the epoxy resin composition (II) of the present invention are not specifically limited. The content of an active group in the curing agent containing the phenol resin (B') is preferably within a range from 0.7 to 1.5 equivalents based on 1 equivalent of the total of epoxy groups of the epoxy resin (A') because the resulting cured article is excellent in characteristics.

If necessary, curing accelerators can also be added to the epoxy resin composition (II) of the present invention. Various curing accelerators can be used and examples thereof include phosphorous-based compound, tertiary amine, imidazole, organic acid metal salt, Lewis acid and amine complex salt. When used as semiconductor encapsulating materials, triphenylphosphine is preferable in case of a phosphorous-based compound and 1,8-diazabicyclo-[5.4.0]-undecene (DBU) is preferable in case of a tertiary amine because of excellent curability, heat resistance, electrical characteristics and moisture resistant reliability.

In the above-described epoxy resin compositions (I) and (II) of the present invention, since the resin itself has an excellent effect of imparting flame retardancy according to selection of the molecular structure of the epoxy resin or a curing agent thereof, the cured article is excellent in flame retardancy even if a conventionally use flame retardant is not mixed. However, in order to exhibit more excellent flame retardancy, in the field of the semiconductor encapsulating material, a non-halogen flame retardant (C) containing substantially no halogen atom may be mixed as far as moldability in the sealing step and reliability of the semiconductor device are not deteriorated.

The epoxy resin composition containing such as non-halogen flame retardant (C) substantially contains no halogen atom, but may contain a trace amount (about 5,000 ppm or less) of a halogen atom due to impurities derived from epihalohydrin contained in the epoxy resin.

Examples of the non-halogen flame retardant (C) include phosphorous-based flame retardant, nitrogen-based flame retardant, silicone-based flame retardant, inorganic-based flame retardant and organic metal salt-based flame retardant and these flame retardant are not specifically limited when used and may be used alone, or a plurality of the same flame retardants may be used or different flame retardants can be used in combination.

As the phosphorous-based flame retardant, inorganic and organic flame retardants can be used. Examples of the inorganic compound include ammonium phosphates such as red phosphorus, monoammonium phosphate, diammonium phosphate, triammonium phosphate and ammonium polyphosphate; and inorganic nitrogen-containing phosphorus compounds such as phosphoric acid amide.

For the purpose of preventing hydrolysis of red phosphorus, it is preferably subjected to a surface treatment. Examples of the method of a surface treatment include (i) a method of coating with an inorganic compound such as magnesium hydroxide, alumimium hydroxide, zinc hydroxide, titanium hydroxide, bismuth oxide, bismuth hydroxide, bismuth nitrate or a mixture thereof, (ii) a method of coating with a thermosetting resin mixture containing inorganic compound such as magnesium hydroxide, alumimium hydroxide, zinc hydroxide or titanium hydroxide, and a phenol resin, (iii) and a method of double-coating a coating film made of an inorganic compound such as magnesium hydroxide, alumimium hydroxide, zinc hydroxide or titanium hydroxide with a thermosetting resin such as phenol resin.

Examples of the organic phosphorous-based compound include commodity organic phosphorous-based compounds such as phosphate ester compound, phosphonic acid compound, phosphinic acid compound, phosphine oxide compound, pholan compound and organic nitrogen-containing phosphorus compound; cyclic organic phosphorus compounds such as 9,10-dihydro-9-oxa-10-phosphaphenanthrene=10-oxide, 10-(2,5-dihydrooxyphenyl)-10H-9-oxa-10-phsophaphenanthrene=10-oxide and 10-(2,7-dihydrooxynaphthyl)-10H-9-oxa-10-phosphaphenanthrene=10-oxide; and derivatives obtained by reacting with a compound such as epoxy resin or phenol resin.

The amount is appropriately selected according to the kind of the phosphorous-based flame retardant, other components of the epoxy resin composition and the degree of desired flame retardancy. When red phosphorus is used as the non-halogen flame retardant in 100 parts by mass of an epoxy resin composition (I) or (II) containing an epoxy resin, a curing agent, a non-halogen flame retardant and other fillers and additives, the amount is preferably within a range from 0.1 to 2.0 parts by mass. When an organic phosphorous compound is used, the amount is preferably within a range from 0.1 to 10.0 parts by mass, and particularly preferably from 0.5 to 6.0 parts by mass.

When the phosphorous-based flame retardant is used, the phosphorous-based flame retardant may be used in combination with hydrotalcite, magnesium hydroxide, boron compound, zirconium oxide, black dye, calcium carbonate, zeolite, zinc molybdate and activated carbon.

Examples of the nitrogen-based flame retardant include triazine compound, cyanuric acid compound, isocyanuric acid compound and phenothiazine, and a triazine compound, a cyanuric acid compound and an isocyanuric acid compound are preferable.

Examples of the triazine compound include, in addition to melamine, acetoguanamine, benzoguanamine, melon, melam, succinoguanamine, ethylenedimelamine, melamine polyphosphate and triguanamine, (i) aminotriazine sulfate compound such as guanylmelamine sulfate, melem sulfate or melam sulfate, (ii) cocondensate of phenols such as phenol, cresol, xylenol, butylphenol and nonylphenol, melamines such as melamine, benzoguanamin, acetoguanamine and formguanamine, and formaldehyde, (iii) mixture of the cocondensate (ii) and phenol resins such as phenolformaldehyde condensate, and (iv) those obtained by modifying the cocondensate (ii) and the mixture (iii) with tung oil or isomerized linseed oil.

Specific examples of the cyanuric acid compound include cyanuric acid and melamine cyanurate.

The amount of the nitrogen-based flame retardant is appropriately selected according to the kind of the nitrogen-based flame retardant, other components of the epoxy resin composition and the degree of desired flame retardancy, and is preferably within a range from 0.05 to 10 parts by mass, and particularly preferably from 0.1 to 5 parts by mass, based on 100 parts by mass of an epoxy resin composition (I) or (II) containing an epoxy resin, a curing agent, a non-halogen flame retardant and other fillers and additives.

When the nitrogen-based flame retardant is used, a metal hydroxide and a molybdenum compound may be used in combination.

The silicone-based flame retardant is not specifically limited as far as it is an organic compound having a silicon atom, and examples thereof include silicone oil, silicone rubber and silicone resin.

The amount of the silicone-based flame retardant is appropriately selected according to the kind of the silicone-based flame retardant, other components of the epoxy resin composition and the degree of desired flame retardancy, and is preferably within a range from 0.05 to 20 parts by mass based on 100 parts by mass of an epoxy resin composition (I) or (II) containing an epoxy resin, a curing agent, a non-halogen flame retardant and other fillers and additives. When the silicone-based flame retardant is used, a molybdenum compound and alumina may be used in combination.

Examples of the inorganic-based flame retardant include metal hydroxide, metal oxide, metal carbonate compound, metal powder, boron compound and low melting point glass.

Specific examples of the metal hydroxide include alumimium hydroxide, magnesium hydroxide, dolomite, hydrotalcite, calcium hydroxide, barium hydroxide and zirconium hydroxide.

Specific examples of the metal oxide include zinc molybdate, molybdenum trioxide, zinc stannate, tin oxide, aluminium oxide, iron oxide, titanium oxide, manganese oxide, zirconium hydroxide, zinc oxide, molybdenum oxide, cobalt oxide, bismuth oxide, chromium oxide, nickel oxide, copper oxide and tungsten oxide.

Specific examples of the metal carbonate compound include zinc carbonate, magnesium carbonate, calcium carbonate, barium carbonate, basic magnesium carbonate, aluminium carbonate, iron carbonate, cobalt carbonate and titanium carbonate.

Specific examples of the metal powder include aluminium, iron, titanium, manganese, zinc, molybdenum, cobalt, bismuth, chromium, nickel, copper, tungsten and tin powders.

Specific examples of the boron compound include zinc borate, zinc metaborate, barium metaborate, boric acid and borax.

Specific examples of the low melting point glass include Seaplea (Bokusui Brown Co Ltd.), hydrated glass $SiO_2$—$MgO$-$H_2O$, $PbO$—$B_2O_3$-based, $ZnO$—$P_2O_5$—$MgO$-based, $P_2O_5$—$B_2O_3$—$PbO$—$MgO$-based, $P$—$Sn$—$O$—$F$-based, $PbO$—$V_2O_5$—$TeO_2$-based, $Al_2O_3$—$H_2O$-based and lead borosilicate-based glassy compounds.

The amount of the inorganic-based flame retardant is appropriately selected according to the kind of the inorganic-based flame retardant, other components of the epoxy resin composition and the degree of desired flame retardancy, and is preferably within a range from 0.05 to 20 parts by mass, and particularly preferably from 0.5 to 15 parts by mass, based on 100 parts by mass of an epoxy resin composition (I) or (II) containing an epoxy resin, a curing agent, a non-halogen flame retardant and other fillers and additives.

Examples of the organic metal salt-based flame retardant include ferrocene, acetylacetonate metal complex, organic metal carbonyl compound, organic cobalt salt compound, organic sulfonic acid metal salt, and compound obtained by ionic bonding or coordinate bonding of a metal atom and an aromatic compound or a heterocyclic compound.

The amount of the organic metal salt-based flame retardant is appropriately selected according to the kind of the organic metal salt-based flame retardant, other components of the epoxy resin composition and the degree of desired flame retardancy, and is preferably within a range from 0.005 to 10 parts by mass based on 100 parts by mass of an epoxy resin composition (I) or (II) containing an epoxy resin, a curing agent, a non-halogen flame retardant and other fillers and additives.

If necessary, the epoxy resin composition (I) or (II) of the present invention can contain inorganic fillers. Examples of the inorganic filler include fused silica, crystalline silica, alumina, silicon nitride and aluminum hydroxide. When the amount of the inorganic filler is particularly large, fused silica is preferably used. The fused silica can be a crushed or spherical silica and a spherical silica is preferably used so as to increase the amount of the fused silica and to suppress an increase in melt viscosity of a molding material. To increase the amount of the spherical silica, it is preferred to appropriately adjust particle size distribution of the spherical silica. Taking account of flame retardancy, the content of the filler is preferably high and is particularly preferably 65% by mass or more based on the total amount of the epoxy resin composition (I) or (II). When used in the conductive paste, a conductive filler such as silver powder or copper powder can be used.

To the epoxy resin composition (I) or (II) of the present invention, various additives such as silane coupling agent, releasant, pigment and emulsifier can be added, if necessary.

The epoxy resin composition (I) or (II) of the present invention can be obtained by uniformly mixing the above-described components. The epoxy resin composition of the present invention, which contains an epoxy resin of the present invention, a curing agent and, if necessary, a curing accelerator, can be easily formed into a cured article. Examples of the cured article include molded cured articles such as laminate, cast article, adhesive layer, coating film and film.

Examples of uses of the epoxy resin composition (I) or (II) of the present invention include semiconductor encapsulating materials, underfill materials, conductive pastes, laminates, resin compositions used for electronic circuit boards, resin casting materials, adhesives, interlayer insulation materials for buildup substrates, and coating materials such as insulating paint. The epoxy resin composition of the present invention can be preferably used as semiconductor encapsulating materials and underfill materials for electronic components, and particularly preferably semiconductor encapsulating materials.

Here, the semiconductor encapsulating material of the present invention comprising the epoxy resin composition (I) or (II) contains, in addition to the epoxy resin(A) and the curing agent (B), or the epoxy resin(A') and the phenol resin (B'), an inorganic filler in the proportion of 70 to 95% by mass based on the total amount of the epoxy resin composition, and can be obtained by the following procedure. That is, an epoxy resin and curing agent and inorganic filler are sufficiently mixed using an extruder, a kneader or a roll to obtain a uniform melt-mixing type epoxy resin composition. In that case, silica is usually used as the filler and the amount of the filler is preferably within a range from 70 to 95% by mass based on 100 parts by mass of the epoxy resin composition as mentioned above. To improve flame retardancy, moisture resistance and solder cracking resistance and to decrease the linear expansion coefficient, the amount of the filler is particularly preferably 80 to 95% by mass or more based on the total amount of the epoxy resin composition. In case of semiconductor package molding, the semiconductor encapsulating material is casted or molded using a transfer molding machine or an injection molding machine and then heated at 50 to 200° C. for 2 to 10 hours to obtain a semiconductor device as a molded article.

The epoxy resin composition (I) or (II) of the present invention can be formed into a composition for printed circuit board, for example, a resin composition for prepreg. According to the viscosity, the epoxy resin composition can be used without using a solvent, and the resin composition for prepreg is preferably prepared by forming into a varnish using an organic solvent. As the organic solvent, a polar solvent having a boiling point of 160° C. or lower such as methyl ethyl ketone, acetone or dimethyl formamide is preferably used, and these organic solvents can be used alone or in combination. A prepreg as a cured article can be obtained by impregnating various reinforcing base materials such as paper, glass cloth, glass nonwoven fabric, aramid paper, aramid cloth, glass mat and glass roving cloth with the resulting varnish and heating at a temperature corresponding to the kind of the solvent, preferably 50 to 170° C. The contents of the resin composition and the reinforcing base material are not specifically limited, and the content of the resin in the prepreg is preferably adjusted within a range from 20 to 60% by mass. When a copper-cladded laminate is produced using the epoxy resin composition, the copper-cladded laminate can be obtained by laying the resulting prepregs one upon another using a conventional method and appropriately laying a copper foil thereon, followed by press-contacting with heating at 170 to 250° C. under pressure of 1 to 10 MPa for 10 minutes to 3 hours.

When the epoxy resin composition (I) or (II) of the present invention is used as a conductive paste, for example, conductive fine particles are dispersed in the epoxy resin composition to give a composition for anisotropic conductive adhesive, a paste resin composition for connection of circuits, which is liquid at room temperature, or an anisotropic conductive adhesive.

An interlayer insulation material for buildup substrate is obtained from the epoxy resin composition (I) or (II) of the present invention in the following manner. That is, the curable resin composition obtained by appropriately mixing a rubber and a filler is coated onto a wiring board having an inner layer circuit formed thereon using a spray coating method or a curtain coating method, and then cured. If necessary, predetermined holes such as throughholes are formed and the wiring board is treated with a roughening agent. The surface is washed with hot water to form irregularity and the wiring board is plated with metal such as copper. The plating method is preferably electroless plating or electroplating treatment, and examples of the roughening agent include oxidizing agent, alkali and organic solvent. Such an operation is optionally repeated successively to alternately buildup and form a resin insulating layer and a conductive layer of a predetermined circuit pattern, and thus a buildup substrate can be obtained. Throughholes are formed after forming a resin insulating layer as an outermost layer. It is also possible to produce a buildup substrate without conducting the step of forming a roughened surface and a plating step by contact-bonding a copper foil coated with a semicured resin composition on a wiring board having an inner layer circuit formed thereon with heating at 170 to 250° C.

The epoxy resin composition (I) of the present invention can also be used as a resist ink. In this case, to the epoxy resin (A), a vinyl-based monomer having an ethylenically unsaturated double bond and a cationic polymerization catalyst as a curing agent (B) are added and also a pigment, talc and a filler are added to give a composition for resist ink, and then the composition is coated onto a printed board using a screen printing method to give a resist ink cured article.

The cured article of the present invention may be obtained by a conventional method of curing an epoxy resin composition. For example, heating temperature conditions may be appropriately selected by the kind of curing agents to be used in combination and purposes, and the composition obtained by the above method may be heated at a temperature within a range from about 20 to 250° C. The epoxy resin composition may be molded by a conventional method and the conditions peculiar to the epoxy resin composition of the present invention are not required.

Therefore, an environmentally friendly epoxy resin composition capable of exhibiting excellent flame retardancy can be obtained by using the epoxy resin (A) or the phenol resin (B') even if a halogen-based flame retardant is not used. Excellent dielectric characteristics in the cured article can realize an increase in operation speed of a high-frequency device. The phenol resin can be produced easily and efficiently by the method of the present invention and, and thus it becomes possible to perform molecular design corresponding to the level of the above-described objective performances.

EXAMPLES

The present invention will now be described in detail by examples and comparative examples. In the following examples and comparative examples, parts and percentages are by mass unless otherwise specified. Melt viscosity at 150° C., GPC, NMR and MS spectrum were measured under the following conditions.
1) Melt viscosity at 150° C.: in accordance with ASTM D4287
2) Method for measurement of softening point: JIS K7234
3) GPC:
   Apparatus: HLC-8220 GPC manufactured by Tosoh Corporation
   Column: TSK-GEL G2000HXL+G2000HXL+G3000HXL+G4000HXL manufactured by Tosoh Corporation
   Solvent: tetrahydrofuran
   Flow rate: 1 ml/min
   Detector: RI
4) NMR: NMR GSX270 manufactured by JEOL Ltd.
5) MS: Double-focusing mass spectrometer AX505H (FD505H) manufactured by JEOL Ltd.

Example 1

Synthesis of Aralkyl Group-Containing Dihydroxy(Polyoxynaphthylene)

In a flask equipped with a thermometer, a dropping funnel, a condenser tube, a distilling tube and a stirrer, 160 g (1.0 mols) of 2,7-dihydroxynaphthalene represented by the following formula:

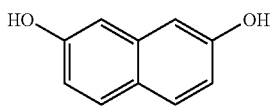

and 108 g (1.0 mols) of benzyl alcohol were charged, followed by stirring at room temperature while bubbling nitrogen. 2.7 g of paratoluenesulfonic acid monohydrate was added. After heating to 150° C. in an oil bath while paying attention to heat generation, water produced was extracted using a distilling tube and the reaction was conducted for additional 5 hours. After the completion of the reaction, 1,000 g of methyl isobutyl ketone were added and, after dissolving, the reaction solution was transferred to a reparatory funnel. After washing with water until rinse water shows neutrality, the solvent was removed from the organic layer with heating under reduced pressure to obtain 240 g an aralkyl group-containing dihydroxy(polyoxynaphthylene) (hereinafter, this is referred to as "compound (1)"). The resulting compound (1) was a brown solid and had a hydroxyl group equivalent of 160 g/eq, a softening point of 77° C. and an ICI viscosity of 0.9 dPa·s.

The results of a FT-IR chart confirmed that an absorption assignable to hydroxyl group (3,700 to 3,400 cm$^{-1}$) is smaller than that of the material (2,7-dihydroxynaphthalene) and an absorption assignable to aromatic ether (1,250 cm$^{-1}$) is produced. From these results, it was considered that the dehydrative etherification reaction of hydroxyl groups occurred.

The results of a $^{13}$C-NMR chart confirmed a methylene bond as a result of an introduction of benzyl group and a structure in which the amount of benzyl group introduced into the naphthalene ring is 0.55 mols among 1.0 mols of benzyl alcohol charged (that is, about 55% of benzyl alcohol added was attached to the naphthalene ring) and the residual about 0.45 mols (that is, about 45% of benzyl alcohol added) of benzyl alcohol was further attached to the produced benzyl as a benzyl group.

The results of FD-MS charts confirmed that peaks could be identified which had molecular weights resulting from the molecular weight of 2,7-dihydroxynaphthalene (Mw: 160) to which were added the molecular weights of a single benzyl group (Mw: 90) (M$^+$=250), two benzyl groups (M$^+$=340), three benzyl groups (M$^+$=430), and four benzyl groups (M$^+$=520), and in addition, from the molecular weight of a dimeric ether structure of 2,7-dihydroxynaphthalene (Mw: 302), which was produced from the intermolecular dehydration of two molecules of 2,7-dihydroxynaphthalene, to which were added the molecular weights of a single benzyl group (Mw: 90) (M$^+$=392), two benzyl groups (M$^+$=482), three benzyl groups (M$^+$=572), and four benzyl groups (M$^+$=662), and furthermore, from the molecular weight of a trimeric ether structure of 2,7-dihydroxynaphthalene (Mw: 444), which was produced from the intermolecular dehydration of three molecules of 2,7-dihydroxynaphthalene, to which were added the molecular weight of a single benzyl group (Mw: 90) (M$^+$=534), two benzyl groups (M$^+$=624), three benzyl groups (M$^+$=714), and four benzyl groups (M$^+$=804). Therefore, these analysis revealed that benzyl groups were attached to 0.55 sites of an average vacant sites of 6p+6, which are present in the chemical formula described above, and in addition, there was formed a structure which had benzyl groups introduced therein at 0.45 sites (q=0.45).

Example 2

Synthesis of Aralkyl-Modified Poly(Oxynaphthalene) Type Epoxy Resin

In a flask equipped with a thermometer, a dropping funnel, a condenser tube and a stirrer, 160 g of the compound (1) obtained in Example 1, 463 g (5.0 mols) of epichlorohydrin, 139 g of n-butanol and 2 g of tetraethylbenzylammonium chloride were charged and dissolved while purging with a nitrogen gas. After heating to 65° C., the pressure was reduced to the pressure at which an azeotrope is produced, and then 90 g (1.1 mols) of an aqueous 49% sodium hydroxide solution was added dropwise over 5 hours. Under the same conditions, stirring was continued for 0.5 hours. The distillate produced by azeotropy during stirring was separated by a Dean-Stark trap and the aqueous layer was removed, and then the reaction was conducted while returning the oil layer into the reaction system. Then, the unreacted epichlorohydrin was distilled off by distillation under reduced pressure. The resulting crude epoxy resin was dissolved in 432 g of methyl isobutyl ketone and 130 g of n-butanol. To the solution, 10 g of an aqueous 10% sodium hydroxide solution was added. After reacting at 80° C. for 2 hours, the solution was repeatedly washed with 150 g of water three times until the pH of the wash becomes neutral. The system was dehydrated by azeotropy and, after precise filtration, the solvent was distilled off under reduced pressure to obtain 210 g of an epoxy resin (hereinafter, this is abbreviated to "epoxy resin (A-1)") comprising a polynaphthylene oxide structure as a main skeleton and having a glycidyloxy group at both molecular ends, an aralkyl group being attached to an aromatic nucleus in the polynaphthylene oxide structure. The resulting epoxy resin had a softening point of 47° C., a melt viscosity at 150° C. of 0.5 dPa·s and an epoxy equivalent of 231 g/eq.

Example 3

Synthesis of Aralkyl Group-Containing Dihydroxy(Polyoxynaphthylene)

In the same manner as in Example 1, except that 108 g of benzyl alcohol was replaced by 216 g (2.0 mols) in Example 1, 330 g of an aralkyl group-containing dihydroxy (polyoxynaphthylene) (hereinafter, this is abbreviated to "compound (2)") was obtained. The resulting compound (2) was a brown solid and had a hydroxyl group equivalent of 180 g/eq, a softening point of 67° C. and a melt viscosity at 150° C. of 0.5 dPa·s.

Example 4

Synthesis of Aralkyl-Modified Poly(Oxynaphthalene) Type Epoxy Resin

In the same manner as in Example 1, except that 180 g of the compound (2) obtained in Example 3 was used in place of 160 g of the compound (1) used as the material in Example 2, 228 g of an epoxy resin (hereinafter, this is abbreviated to "epoxy resin (A-2)") comprising a polynaphthylene oxide structure as a main skeleton and having a glycidyloxy group at both molecular ends, an aralkyl group being attached to an aromatic nucleus in the polynaphthylene oxide structure was obtained. The resulting epoxy resin had a softening point of 40° C., a melt viscosity at 150° C. of 0.4 dPa·s and an epoxy equivalent of 244 g/eq.

Example 5

Synthesis of Aralkyl Group-Containing Dihydroxy(Polyoxynaphthylene)

In the same manner as in Example 1, except that 108 g of benzyl alcohol was replaced by 92 g (0.85 mols) in Example 1, 230 g of an aralkyl group-containing dihydroxy(polyoxynaphthylene) (hereinafter, this is abbreviated to "compound (3)"). The resulting compound (3) was a brown solid and had a hydroxyl group equivalent of 164 g/eq, a softening point of 80° C. and a melt viscosity at 150° C. of 1.2 dPa·s.

To conduct a structural analysis of the compound (3) by FD-MS and $^{13}$C-NMR and to use in the measurement of FD-MS by a trimethylsilylation method, the compound (3) was trimethylsilylated and then peaks of the following (a.) and (b.) were confirmed by FD-MS.

(a.) peaks having molecular weights resulting from the molecular weight of a 2,7-dihydroxynaphthalene trimer (Mw: 444) to which were added the molecular weights of a single benzyl group (molecular weight Mw: 90) (Mw: 534), two trimethylsilyl groups (molecular weight Mw: 72) ($M^+$=678), and three trimethylsilyl groups ($M^+$=751)

(b.) peaks having molecular weights resulting from the molecular weight of a 2,7-dihydroxynaphthalene trimer (Mw: 444) to which were added the molecular weights of two benzyl groups (molecular weight Mw: 90) (Mw: 624), two trimethylsilyl groups (molecular weight Mw: 72) ($M^+$=768), and three trimethylsilyl groups ($M^+$=841)

Therefore, it could be confirmed that the compound (3) comprises a compound having a structure in which 1 mol of a benzyl group is attached to 1 mol of a 2,7-dihydroxynaphthalene trimer ether compound, a compound having a structure in which 2 mols of a benzyl group is attached to 1 mol of a 2,7-dihydroxynaphthalene trimeric ether compound, a compound having a structure in which 1 mol of a benzyl group is attached to 1 mol of a trimeric compound having a structure, which was produced from the intermolecular dehydration of 1 mol of 2,7-dihydroxynaphthalene to 1 mol of a 2,7-dihydroxynaphthalene dimeric ether, and a compound having a structure in which 2 mols of benzyl groups are attached to 1 mol of a trimeric compound having a structure, which was produced from the intermolecular dehydration of 1 mol of 2,7-dihydroxynaphthalene to one mol of a 2,7-dihydroxynaphthalene dimeric ether.

Example 6

Synthesis of Aralkyl-Modified Poly(Oxynaphthalene) Type Epoxy Resin

In the same manner as in Example 2, except that 164 g of the compound (3) obtained in Example 5 was used in place of 160 g of the compound (1) used as the material in Example 2, 210 g of an epoxy resin (hereinafter, this is abbreviated to "epoxy resin (A-3)") comprising a polynaphthylene oxide structure as a main skeleton and having a glycidyloxy group at both molecular ends, an aralkyl group being attached to an aromatic nucleus in the polynaphthylene oxide structure was obtained. The resulting epoxy resin had a softening point of 54° C., a melt viscosity at 150° C. of 0.7 dPa·s and an epoxy equivalent of 235 g/eq.

Example 7

Synthesis of Aralkyl Group-Containing Dihydroxy(Polyoxynaphthylene)

In the same manner as in Example 1, except that 108 g of benzyl alcohol was replaced by 76 g (0.7 mols) in Example 1, 210 g of an aralkyl group-containing dihydroxy(polyoxynaphthylene) (hereinafter, this is abbreviated to "compound (4)"). The resulting compound (4) was a brown solid and had a hydroxyl group equivalent of 156 g/eq, a softening point of 83° C. and a melt viscosity at 150° C. of 1.9 dPa·s.

In the same manner as in Example 5, in order to use in the measurement of FD-MS by a trimethylsilylation method, the compound (3) was trimethylsilylated.

Example 8

Synthesis of Aralkyl-Modified Poly(Oxynaphthalene) Type Epoxy Resin

In the same manner as in Example 2, except that 156 g of the compound (4) obtained in Example 7 was used in place of 160 g of the modified dihydroxynaphthalene compound (1) used as the material in Example 2, 200 g of an epoxy resin (hereinafter, this is abbreviated to "epoxy resin (A-4)") comprising a polynaphthylene oxide structure as a main skeleton and having a glycidyloxy group at both molecular ends, an aralkyl group being attached to an aromatic nucleus in the polynaphthylene oxide structure was obtained. The resulting epoxy resin had a softening point of 66° C., a melt viscosity at 150° C. of 1.3 dPa·s and an epoxy equivalent of 255 g/eq.

Example 9

Synthesis of Aralkyl Group-Containing Dihydroxy(Polyoxynaphthylene)

In the same manner as in Example 1, except that 160 g of 2,7-dihydroxynaphthalene was replaced by 160 g of 1,6-dihydroxynaphthalene in Example 1, 242 g of an aralkyl group-containing dihydroxy(polyoxynaphthylene) (hereinafter, this is abbreviated to "compound (5)"). The resulting compound (5) was a brown solid and had a hydroxyl group equivalent of 147 g/eq, a softening point of 67° C. and an ICI viscosity of 0.5 dPa·s.

Example 10

Synthesis of Aralkyl-Modified Poly(Oxynaphthalene) Type Epoxy Resin

In the same manner as in Example 2, except that 147 g of the compound (5) obtained in Example 9 was used in place of 160 g of the compound (1) used as the material in Example 2, 211 g of an epoxy resin (hereinafter, this is abbreviated to "epoxy resin (A-5)") comprising a polynaphthylene oxide structure as a main skeleton and having a glycidyloxy group at both molecular ends, an aralkyl group being attached to an aromatic nucleus in the polynaphthylene oxide structure was obtained. The resulting epoxy resin had a softening point of 43° C., a melt viscosity at 150° C. of 0.5 dPa·s and an epoxy equivalent of 211 g/eq.

Comparative Example 1

Synthesis of Benzylated Novolak Resin and Conversion of it into Epoxy Resin

In the same manner as in Example 1, except that 160 g (1.0 mols) of 2,7-dihydroxynaphthalene was replaced by 103 g (1.0 equivalents) of a phenol novolak oligomer (manufactured by Showa Highpolymer Co., Ltd. under the trade name of BRG-555, softening point: 69° C., hydroxyl group equivalent: 103 g/eq, ICI viscosity: 0.7 dPa·s) and also 432 g (4.0 mols) of benzyl alcohol was replaced by 75.6 g (0.7 mols) of benzyl alcohol in Example 1, 146 g of a comparative polybenzylated phenol novolak oligomer compound (hereinafter abbreviated to "benzylated novolak resin"). The resulting enzylated novolak resin was a brown solid and had a hydroxyl group equivalent of 166 g/eq, a softening point of 70° C. and ICI viscosity of 0.7 dPa·s. In the same manner as in Example 1, except that 166 g of a benzylated novolak resin was used in place of 160 g of the compound (1) in Example 1, 215 g of a comparative epoxy resin (hereinafter abbreviated to "epoxy resin (A'-1)") was obtained. The resulting epoxy resin had a softening point of 40° C., a melt viscosity at 150° C. of 0.5 dPa·s and an epoxy equivalent of 245 g/eq.

Examples 11 to 19 and Comparative Examples 2 to 4

Using the epoxy resins (A-1) to (A-5) obtained in Examples, the epoxy resin (A'-1), YX-4000H (tetramethyl biphenol type epoxy resin, epoxy equivalent: 195 g/eq) manufactured by Japan Epoxy Resins Co., Ltd., NC-3000 (biphenyl novolak type epoxy resin, epoxy equivalent: 274 g/eq) manufactured by Nippon Kayaku Co., Ltd. and N-665-EXP (cresol novolak type epoxy resin, epoxy equivalent: 203 g/eq) manufactured by DAINIPPON INK & CHEMICALS Co., Ltd. as the epoxy resin; MILEX® XLC-LL (phenol aralkyl resin, hydroxyl group equivalent: 176 g/eq) manufactured by Mitsui Chemicals Co., Ltd. as the curing agent phenol resin; triphenyl phopshine (TPP) as the curing accelerator; condensed phosphate ester (PX-200, manufactured by Daihachi Chemical Industry Co., Ltd.) and magnesium hydroxide (Echomag Z-10, manufactured by Air Water Inc.) as the flame retardant; spherical silica (S-COL, manufactured by Micron Co., Ltd.) as the inorganic filler; γ-glycidoxytriethoxysilane (KBM-403, manufactured by SHIN-ETSU CHEMICAL CO., LTD.) as the silane coupling agent; carnauba wax (PEARL WAX No. 1-P, manufactured by Cerarica Noda Co. Ltd.); and carbon black according to the formulations shown in Table 1, these components were melt-kneaded at a temperature of 85° C. for 5 minutes using a twin roll to obtain the objective compositions. Physical properties of the cured article were evaluated by the following procedure. That is, samples for evaluation were produced by the following method using the above compositions, and then heat resistance, flame retardancy and dielectric characteristics were determined by the following method. The results are shown in Table 1.

<Gel Time>

0.15 g of an epoxy resin composition is placed on a cure plate (manufactured by THERMO ELECTRIC Co., Ltd.) heated to 175° C. and time measurement initiates using a stop watch. The sample is uniformly stirred using a bar and, when the sample is cut in the form of string and remained on the plate, the stop watch is stopped. The time required for the sample to be cut and remained on the plate was taken as a gel time.

<Flame Retardancy>

Samples for evaluation, each measuring 12.7 mm in width, 127 mm in length and 1.6 mm in thickness were obtained by molding at a temperature of 175° C. for 90 seconds using a transfer molding machine and curing at a temperature of 175° C. for 5 hours. Using 5 test samples having a thickness of 1.6 mm thus obtained, a combustion test was conducted in accordance with a UL-94 test method.

<Measurement of Dielectric Characteristics>

Samples for evaluation, each measuring 25 mm in width, 75 mm in length and 2.0 mm in thickness were obtained by molding at a temperature of 175° C. for 90 seconds using a transfer molding machine and curing at a temperature of 175° C. for 5 hours. Each of test samples thus obtained was bone-dried and then stored in a room at 23° C. and a humidity of 50% for 24 hours to obtain a cured article. The dielectric constant and dielectric dissipation factor at a frequency of 100 MHz of the resulting cured article were measured by a method defined in MS-C-6481 using an impedance material analyzer "HP4291B" manufactured by Agilent Technology Co., Ltd.

TABLE 1

Formulation of epoxy resin composition (parts) and evaluation results

| | | Examples | | | | | | | | | Comparative Examples | | |
|---|---|---|---|---|---|---|---|---|---|---|---|---|---|
| | | 11 | 12 | 13 | 14 | 15 | 16 | 17 | 18 | 19 | 2 | 3 | 4 |
| Epoxy | A-1 | 76 | | | | | 39 | 48 | | | | | |
| | A-2 | | 78 | | | | | | 78 | 78 | | | |
| | A-3 | | | 76 | | | | | | | | | |
| | A-4 | | | | 79 | | | | | | | | |
| | A-5 | | | | | 73 | | | | | | | |
| | NC-3000 | | | | | | | 47 | | | | | 83 |
| | N-650-EXP | | | | | | 38 | | | | | | |
| | A'-1 | | | | | | | | | | 78 | 94 | |
| Curing agent | XLC-LL | 58 | 56 | 58 | 55 | 61 | | | 56 | 56 | 56 | | 51 |
| | TD-2131 | | | | | | | 39 | | | | 40 | |
| | Compound (1) | | | | | | 57 | | | | | | |
| Condensed phosphate ester | | | | | | | | | | 30 | | | |
| Magnesium hydroxide | | | | | | | 20 | 20 | | | | | |
| TPP | | 3 | 3 | 3 | 3 | 3 | 3 | 3 | 3 | 3 | 3 | 3 | 3 |
| Fused silica | | 850 | 850 | 850 | 850 | 850 | 850 | 850 | 850 | 850 | 850 | 850 | 850 |
| Coupling agent | | 5 | 5 | 5 | 5 | 5 | 5 | 5 | 5 | 5 | 5 | 5 | 5 |
| Caruauba wax | | 5 | 5 | 5 | 5 | 5 | 5 | 5 | 5 | 5 | 5 | 5 | 5 |

TABLE 1-continued

| | Examples | | | | | | | | | Comparative Examples | | |
|---|---|---|---|---|---|---|---|---|---|---|---|---|
| | 11 | 12 | 13 | 14 | 15 | 16 | 17 | 18 | 19 | 2 | 3 | 4 |
| Carbon black | 3 | 3 | 3 | 3 | 3 | 3 | 3 | 3 | 3 | 3 | 3 | 3 |
| Class of combustion test | V-0 | V-0 | V-0 | V-0 | V-0 | V-0 | V-0 | V-0 | V-0 | self-extinguished | self-extinguished | V-1 |
| 1* | 3 | 4 | 2 | 2 | 4 | 4 | 2 | 2 | 2 | 32 | 35 | 19 |
| 2* | 25 | 39 | 10 | 9 | 35 | 35 | 19 | 9 | 10 | 138 | 160 | 90 |
| Dielectric constant | 2.82 | 2.8 | 2.82 | 2.83 | 2.85 | 2.85 | 2.91 | 2.79 | 2.76 | 3.2 | 3.32 | 3.16 |
| Dielectric dissipation factor ($\times 10^{-4}$) | 80 | 94 | 78 | 77 | 85 | 85 | 92 | 93 | 95 | 132 | 160 | 125 |

Notes of Table 1:
*1: Maximum flame maintenance time for a single flame contact (seconds)
*2: Total flame maintenance time of 5 test samples (seconds)

In Table 1, "compound (1)" is an aralkyl group-containing dihydroxy(polyoxynaphthalene) obtained in Example 1 and evaluation results indicated by "self-extinguished" correspond to the level wherein samples do not satisfy flame retardancy ($\Sigma F \leq 250$ seconds and $F_{max} \leq 30$ seconds) required to V-1, none of samples shows any ignition (arrival of flame at a clamp), resulting in extinction.

What is claimed is:

1. A method for producing an epoxy resin, which comprises the steps of:
    reacting a dihydroxynaphthalene compound (a1) with an aralkylating agent (a2) represented by the following Structural formula (2):

Structural formula (2)

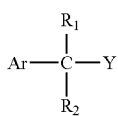

wherein $R_1$ and $R_2$ each independently represents methyl group or hydrogen atom, Ar represents phenylene group, a phenylene group which is nuclear-substituted with 1 to 3 alkyl groups having 1 to 4 carbon atoms, naphthylene group, or a naphthylene group which is nuclear-substituted with 1 to 3 alkyl groups having 1 to 4 carbon atoms, and Y represents a halogen atom, an alkoxy group or hydroxyl group, in the presence of an acid catalyst to obtain a phenol resin having a molecular structure comprising a polyaryleneoxy structure as a main skeleton and a phenolic hydroxyl group and a structural segment represented by the following structural formula (1) being attached to an aromatic ring of the polyaryleneoxy structure, Structural formula (1)

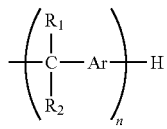

wherein $R_1$, $R_2$, Ar are as defined in the Structural formula (2), and n represents an average number of repeating units of 0.1 to 4, and
    reacting the resulting phenol resin with epihalohydrins (a3).

2. The method according to claim 1, wherein a reaction ratio of the dihydroxynaphthalene compound (a1) to the aralkylating agent (a2), (a1)/(a2), is within a range from 1/0.1 to 1/1.0 in terms of a molar ratio.

3. The method according to claim 2, wherein a reaction ratio of the dihydroxynaphthalene compound (a1) to the aralkylating agent (a2), (a1)/(a2), is within a range from 1/0.1 to 1/10 in terms of a molar ratio.

* * * * *